United States Patent
Bae et al.

(10) Patent No.: US 12,496,799 B2
(45) Date of Patent: Dec. 16, 2025

(54) ELECTRONIC DEVICE INCLUDING FOLDABLE DISPLAY

(71) Applicant: Samsung Electronics Co., Ltd., Gyeonggi-do (KR)

(72) Inventors: Jaehyun Bae, Gyeonggi-do (KR); Youngmin Moon, Gyeonggi-do (KR); Hyunsuk Choi, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 341 days.

(21) Appl. No.: 18/199,418

(22) Filed: May 19, 2023

(65) Prior Publication Data

US 2023/0292456 A1    Sep. 14, 2023

Related U.S. Application Data

(63) Continuation of application No. PCT/KR2022/008816, filed on Jun. 22, 2022.

(30) Foreign Application Priority Data

Jun. 24, 2021  (KR) .................. 10-2021-0082471

(51) Int. Cl.
  *B32B 3/08* (2006.01)
  *B32B 3/04* (2006.01)

(52) U.S. Cl.
  CPC ............. *B32B 3/08* (2013.01); *B32B 3/04* (2013.01); *B32B 2250/05* (2013.01); *B32B 2307/412* (2013.01); *B32B 2457/20* (2013.01)

(58) Field of Classification Search
  CPC ......... B32B 3/08; B32B 3/04; B32B 2250/05; B32B 2307/412; B32B 2457/20
  (Continued)

(56) References Cited

U.S. PATENT DOCUMENTS 10,324,560 B2   6/2019   Kim
10,755,991 B2   8/2020   Park et al.
(Continued)

FOREIGN PATENT DOCUMENTS

JP    2020-71434 A    5/2020
KR    10-1574923 B1   12/2015
(Continued)

OTHER PUBLICATIONS

Korean Office Action dated Oct. 24, 2025.

*Primary Examiner* — Betelhem Shewareged
(74) *Attorney, Agent, or Firm* — Cha & Reiter, LLC

(57) ABSTRACT

According to certain embodiments, a foldable electronic device comprises: a flexible display disposed on a front surface of the foldable electronic device; a housing forming an exterior of the foldable electronic device and foldable around a folding axis, the housing comprising a bezel formed along an edge of the flexible display; a window stacked on the flexible display; and an adhesive layer bonding the window to another element, the adhesive layer comprising: a first area comprising a first adhesive; and a second area which is formed along an edge of the first area, and has an area which corresponds to the bezel, the second area comprising a second adhesive; wherein a strength of the second adhesive can be weakened in a different manner than the strength of the first adhesive.

20 Claims, 15 Drawing Sheets

(58) Field of Classification Search
USPC .......................................................... 428/192
See application file for complete search history.

(56) References Cited

U.S. PATENT DOCUMENTS

| | | | |
|---|---|---|---|
| 11,245,089 | B2 | 2/2022 | Shin et al. |
| 11,787,206 | B2* | 10/2023 | Nishihara .............. B41J 15/044 |
| | | | 428/32.84 |
| 2011/0187960 | A1 | 8/2011 | Kobayashi et al. |
| 2012/0202030 | A1 | 8/2012 | Kondo et al. |
| 2017/0166786 | A1 | 6/2017 | Moon et al. |
| 2018/0120997 | A1 | 5/2018 | Moon et al. |
| 2020/0251671 | A1* | 8/2020 | Chu .......................... B32B 3/08 |
| 2020/0413551 | A1 | 12/2020 | Du |
| 2021/0063806 | A1 | 3/2021 | Kim et al. |
| 2022/0141969 | A1 | 5/2022 | Cho et al. |
| 2023/0209755 | A1* | 6/2023 | Yun ................... G02F 1/133331 |
| | | | 361/807 |
| 2023/0292456 | A1* | 9/2023 | Bae .......................... G09F 9/30 |

FOREIGN PATENT DOCUMENTS

| | | | |
|---|---|---|---|
| KR | 10-2016-0141263 | A | 12/2016 |
| KR | 10-2017-0063344 | A | 6/2017 |
| KR | 10-2019-0082169 | A | 7/2019 |
| KR | 10-2020-0019000 | A | 2/2020 |
| KR | 10-2020-0101220 | A | 8/2020 |
| KR | 10-2177081 | B1 | 11/2020 |
| KR | 10-2021-0013426 | A | 2/2021 |
| KR | 10-2408492 | B1 | 6/2022 |

* cited by examiner

ELECTRONIC DEVICE INCLUDING FOLDABLE DISPLAY

CLAIM OF PRIORITY

This application is a continuation of International Application No. PCT/KR2022/008816, filed on Jun. 22, 2022, which claims priority to Korean Patent Application No. 10-2021-0082471 filed Jun. 24, 2021, in the Korean Intellectual Property Office, the disclosures of which are herein incorporated by reference.

BACKGROUND

Technical Field

Certain embodiments disclosed herein relate to an electronic device including a foldable display.

Description of Related Art

Foldable displays allow the user to enjoy a large screen, without reducing the portability of the electronic device. The user can enjoy the larger screen by unfolding the electronic device. When the user is carrying the electronic device, the user can fold the electronic device, thereby reducing the dimensions of the electronic device.

However, displays forming the exterior of electronic devices and thus can be damaged by external impacts. Therefore, an electronic device including a display typically includes a single window or multiple windows, thereby protecting the display.

An electronic device may further include a window for protecting a display module. The window may be securely attached to another element of the display device. Even if the window is solely damaged, the entire module constituting the display may need to be replaced because the window is impractical to detach from the other element of the display device. This increases the replacement cost, while wasting an otherwise operable display.

This can become even more pronounced with foldable displays because the window may be thinner, and thus more susceptible to cracking.

Using a weaker adhesive may result in multiple windows detaching from the display due to wear.

SUMMARY

According to certain embodiments, a foldable electronic device comprises: a flexible display disposed on a front surface of the foldable electronic device; a housing forming an exterior of the foldable electronic device and foldable around a folding axis, the housing comprising a bezel formed along an edge of the flexible display; a window stacked on the flexible display; and an adhesive layer bonding the window to another element, the adhesive layer comprising: a first area comprising a first adhesive; and a second area which is formed along an edge of the first area, and has an area which corresponds to the bezel, the second area comprising a second adhesive; wherein a strength of the second adhesive can be weakened in a different manner than the strength of the first adhesive.

According to certain embodiments, a foldable electronic device comprises: a flexible display disposed on a front surface of the foldable electronic device; a housing configured to form an exterior of the foldable electronic device and be foldable around an axis, the housing comprising a bezel formed along an edge of the flexible display; a first window bonded to the flexible display; and a second window bonded on the first window having one side exposed to an outside of the foldable electronic device; and an adhesive layer disposed between the flexible display and the first window bonding the flexible display and the first window, wherein the adhesive layer comprises: a first area comprising a first adhesive; and a second area formed along an edge of the first area, having an area corresponding to the bezel, the second area comprising a second adhesive; wherein an adhesive strength of the second adhesive can be weakened in a different way from the first adhesive.

According to certain embodiments, a foldable electronic device comprises: a flexible display disposed on a front surface of the foldable electronic device; a housing forming an exterior of the foldable electronic device and foldable around a folding axis, the housing comprising a bezel formed along an edge of the flexible display; a window stacked on the flexible display; and an adhesive layer bonding the window and another element of the flexible display, wherein the adhesive layer comprises: a first area, which is exposed to an outside comprising a first adhesive; and a second area covered by the bezel and formed along an edge of the first area, comprising a second adhesive; wherein an adhesive strength of the second adhesive can be weakened in a different way from the first adhesive.

BRIEF DESCRIPTION OF THE DRAWINGS

In connection with the description of the drawings, same or similar reference numerals will be used to refer to same or similar elements.

DETAILED DESCRIPTION

Hereinafter, certain embodiments of the disclosure will be described with reference to the accompanying drawings.

However, the descriptions are not intended to limit the disclosure to specific embodiments, and should be understood to include various modifications, equivalents, and/or alternatives of the embodiments of the disclosure.

According to certain embodiments disclosed herein, an electronic device may provide an easily replaceable window. For example, the electronic device may provide windows such that only the broken window can be selectively replaced.

According to certain embodiments disclosed herein, the lifespan of a component of an electronic device may be increased, and the quality of the electronic device may be improved.

In addition, according to certain embodiments, an electronic device may be provided wherein the separation between a window and a display due to wear can be avoided.

Various other advantageous effects identified explicitly or implicitly through the disclosure may be provided.

Figure 1:
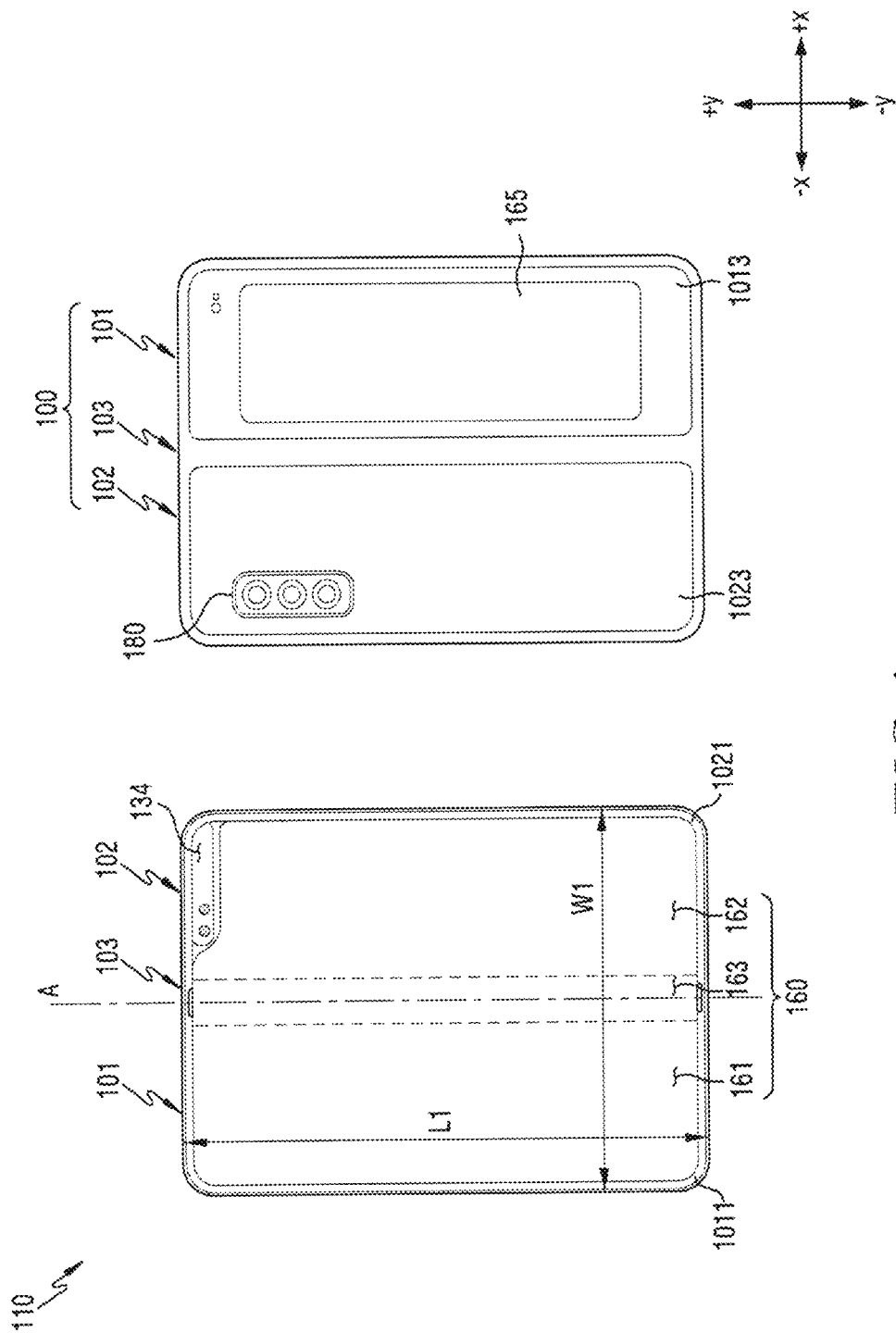
FIG. 1 illustrates an unfolded state of an electronic device according to an embodiment.
Figure 2:
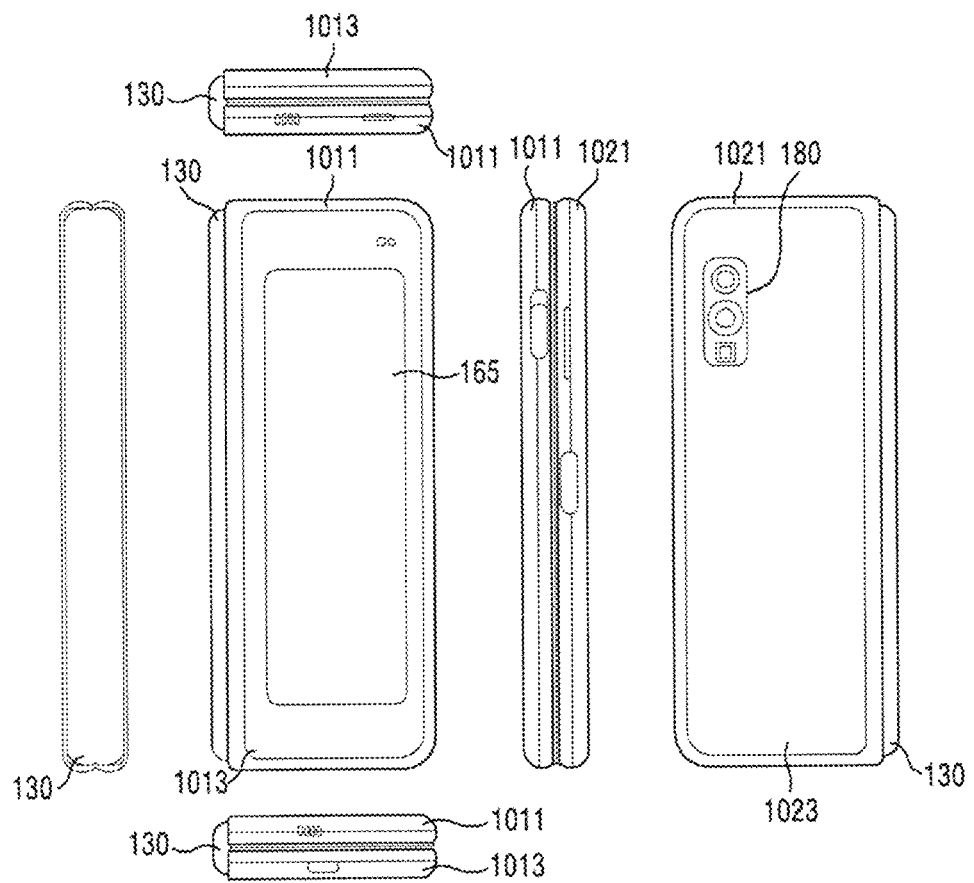
FIG. 2 illustrates a folded state of an electronic device according to an embodiment.

FIGS. 1 and 2 describe a foldable electronic device. The window in a foldable electronic device is susceptible to cracking or breaking because it is thinner in certain areas to allow for folding.

Foldable Electronic Device

An electronic device that is foldable provides the benefits of a large screen without detracting from portability. When the user is stationary and using the electronic device, the user places the electronic device in the unfolded state as shown in FIG. 1. In the unfolded state, the display has L1×W1 dimensions. However, when carrying the electronic device, the user can fold the electronic device as shown in FIG. 2, thereby reducing the W1 dimension in half.

FIG. 1 illustrates an unfolded state of an electronic device according to an embodiment. FIG. 2 illustrates a folded state of an electronic device according to an embodiment.

Referring to FIG. 1 and FIG. 2 together, in an embodiment, an electronic device 110 may include a foldable housing 100 (hereafter, shortly referred to as a "housing" 100) and a flexible or a foldable display 160 (hereinafter, shortly referred to as a "display" 160) disposed in a space formed by the housing 100. In the disclosure, a surface, on which the display 160 is disposed, may be defined as a first surface or the front surface of the electronic device 110. In addition, a surface opposite to the front surface may be defined as a second surface or the rear surface of the electronic device 110. In addition, a surface, which is configured to surround the space between the front surface and the rear surface, may be defined as a third surface or a side surface of the electronic device 110.

The housing 100 may have a substantially rectangular shape in the unfolded state of FIG. 1. For example, the housing 100 may have a designated width W1 and a designated length L1 longer than the designated width W1. For another example, the housing 100 may have a designated width W1 and a designated length L1 which is substantially the same as or shorter than the designated width W1. For example, the designated width W1 may be the width of the display 160. In an embodiment, the housing 100 of the electronic device 110 may be folded or unfolded with reference to a folding axis A which is substantially parallel to the long edge (e.g., the edge, which faces the y-axis direction, among the edges of the housing 100 of the electronic device 110 of FIG. 1) of the rectangular shape.

The housing 100 may include a first housing 101, a second housing 102, and a connection part 103. The connection part 103 may be disposed between the first housing 101 and the second housing 102. The connection part 103 may be coupled to the first housing 101 and the second housing 102, and the first housing 101 and/or the second housing 102 may rotate about the connection part 103 (or the folding axis A).

The first housing 101 may include a first side member 1011 and a first rear cover 1013. In an embodiment, the second housing 102 may include a second side member 1021 and a second rear cover 1023.

The first side member 1011 may be configured to extend along an edge of the first housing 101, and to form at least a portion of the side surface of the electronic device 110. The first side member 1011 may include at least one conductive portion formed of a conductive material (e.g., metal). The conductive portion may be configured to operate as an antenna radiator for transmitting and/or receiving RF signals. Similarly to the first side member 1011, the second side member 1021 may be configured to form a portion of the side surface of the electronic device 110, and at least a portion of the second side member 1021 may be formed of a conductive material to operate as an antenna radiator.

The first side member 1011 and the second side member 1021 are arranged at both sides with reference to the folding axis A, and may have a substantially symmetrical shape with respect to the folding axis A.

The angle formed by or the distance between the first side member 1011 and the second side member 1021 may be changed according to whether the state of the electronic device 110 is an unfolded state, a folded state, or an intermediate state.

The housing 100 may be configured to form a recess for accommodating the display 160. The recess may have a shape corresponding to that of the display 160. According to an embodiment, the recess may be emitted therefrom.

A sensor area 134 may be formed to be adjacent to a corner of the second housing 102 and may have a predetermined area. However, the arrangement, shape, and size of the sensor area 134 may not be limited to the illustrated embodiment. For example, in another embodiment, the sensor area 134 may be provided in another corner of the housing 100 or any area between the top corner and the bottom corner thereof. For another example, the sensor area 134 may also be omitted therefrom. For example, components arranged in the sensor area 134 may be arranged below the display 160, or may be arranged at other positions in the housing 100. In an embodiment, components, which are embedded in the electronic device 110 and configured to perform various functions, may be exposed on the front surface of the electronic device 110, through the sensor area 134 or through one or more openings provided in the sensor area 134. In certain embodiments, the components may include various kinds of sensors. For an example, the sensors may include at least one of a front camera, a receiver, or a proximity sensor.

The first rear cover 1013 may be disposed in the first housing 101 on the rear surface of the electronic device 110. The first rear cover 1013 may have a rim substantially rectangular shape. Similarly to the first rear cover 1013, the second rear cover 1023 may be disposed in the second housing 102 on the rear surface of the electronic device 110.

The first rear cover 1013 and the second rear cover 1023 may have a substantially symmetrical shape around the folding axis A. However, the first rear cover 1013 and the second rear cover 023 may not necessarily have a mutually symmetrical shape, and in another embodiment, the electronic device 110 may include the first rear cover 1013 and/or the second rear cover 1023 which have various shapes. In addition, in another embodiment, the first rear cover 1013 may be integrally formed with the first side member 1011, and the second rear cover 1023 may be integrally formed with the second side member 1021.

The first rear cover 1013, the second rear cover 1023, the first side member 1011, and the second side member 1021 may be configured to form a space which allows various components (e.g., a printed circuit board or a battery) of the electronic device 110 to be arranged therein.

One or more components may be arranged or may be visually exposed on the rear surface of the electronic device 110. For example, at least a part of a sub-display 165 may be visually exposed through at least an area of the first rear cover 1013. For example, the sub-display 165 may be visually exposed through the entire area of the first rear cover 1013, but the area, which allows the sub-display 165 to be exposed therethrough, may not be limited to the above-described embodiment. For another example, the rear camera 180 may be visually exposed through at least an area of the second rear cover 1023. For another example, a rear camera 180 may be disposed in an area of the rear surface of the electronic device 110.

The housing 100 of the electronic device 110 may not be limited to the shape and the combination illustrated in FIGS. 1 and 2, and may be implemented by other shapes or a combination and/or coupling of components.

Referring to FIG. 2, the connection part 103 may be implemented such that the first housing 101 and the second housing 102 are mutually rotatable. For example, the connection part 103 may include a hinge structure coupled to the first housing 101 and the second housing 102. In an embodiment, the connection part 103 may include a hinge cover 130 disposed between the first side member 1011 and the second side member 1021 to cover inner components (for example, the hinge structure) thereof. In an embodiment, the hinge cover 130 may be covered by a part of the first side member 1011 and the second side member 1021 or may be exposed to the outside, according to a state of (an unfolded state (flat state) or a folded state) of the electronic device 110. For example, the hinge cover 130 may be configured to allow the size of the area exposed to the outside to be changed according to a state (an unfolded state (flat state) or a folded state) of the electronic device 110.

As an example, as illustrated in FIG. 1, when the electronic device 110 is in an unfolded state, at least a part of the hinge cover 130 may be covered by the first side member 1011 and the second side member 1021 so as not to be exposed. As an example, as illustrated in FIG. 2, when the electronic device 110 is in an unfolded state, at least a part of the hinge cover 130 may be exposed to the outside, between the first side member 1011 and the second side member 1021.

As an example, when the first side member 1011 and the second side member 1021 are in an intermediate state in which the first side member and the second side member are folded with a certain angle, a part of the hinge cover 130 may be partially exposed to the outside, between the first side member 1011 and the second side member 1021. However, in the case, the exposed area of the hinge cover 130 may be smaller than that of the fully folded state of FIG. 2.

The display 160 may be disposed in the space formed by the housing 100. For example, the display 160 may be configured to form most of the front surface of the electronic device 110. For example, the front surface of the electronic device 110 may include the display 160, and a partial area of the first side member 1011 and a partial area of the second side member 1021, which are adjacent to the display 160. For another example, the rear surface of the electronic device 110 may include the first rear cover 1013, a partial area of the first side member 1011, which is adjacent to the first rear cover 1013, the second rear cover 1023, and a partial area of the second side member 1021, which is adjacent to the second rear cover 1023.

The display 160 may include a flexible display, of which at least a partial area can be transformed into a flat-surface or a curved-surface. In an embodiment, the display 160 may include a folding area 163, a first area 161, and a second area 162. The folding area 163 may be configured to extend along the folding axis A, and with reference to the folding area 163, the first area 161 may be disposed at one side (e.g., the left side of the folding area 163 illustrated in FIG. 1) and the second area 162 may be disposed at the other side (e.g., the right side of the folding area 163 illustrated in FIG. 1). For another example, the first area 161 may be an area disposed in the first housing 101, and the second area 162 may be an area disposed in the second housing 102. The folding area 163 may be an area disposed on the connection part 103.

The division of the area of the display 160 illustrated in FIG. 1 and FIG. 2 may be exemplary, and the area of the display 160 may be divided into multiple (e.g., four or more, or two) areas according to a structure or a function thereof. As an example, in the embodiment illustrated in FIG. 1, the areas of the display 160 may be divided by the folding area 163 or the folding axis A, but in another embodiment, the areas of the display 160 may be divided with reference to another folding area or another folding axis.

In an embodiment, the first area 161 and the second area 162 may have an overall symmetrical shape around the folding area 163. However, differently from the first area 161, the second area 162 may include a notch which is cut according to the presence of the sensor area 134, but in an area other than the sensor area, may have a symmetrical shape with the first area 161. For example, the first area 161 and the second area 162 may include portions having shape symmetric to each other and portions having shapes asymmetric to each other. For example, the notch of the second area 162 may be omitted therefrom.

Hereinafter, the operations of the first side member 1011 and the second side member 1021 and each area of the display 160 will be described according to a state (e.g., an unfolded state and a folded state) of the electronic device 110.

In an embodiment, when the electronic device 110 is in an unfolded state (e.g., FIG. 1), the first side member 1011 and the second side member 1021 may be arranged to face substantially the same direction while forming an angle of about 180 degrees. The surface of the first area 161 and the surface of the second area 162 of the display 160 may form 180 degrees to each other, and may face substantially the same direction (e.g., the front direction of the electronic device). For example, the folding area 163 may be configured to form the same flat-surface as the first area 161 and the second area 162.

In an embodiment, when the electronic device 110 is in a folded state (e.g., FIG. 2), the first side member 1011 and the second side member 1021 may be arranged to face each other. The surface of the first area 161 and the surface of the second area 162 of the display 160 may form a narrow angle (e.g., an angle between 0 degrees and 10 degrees) and thus may face each other. At least a part of the folding area 163 may be formed as a curved-surface having a predetermined curvature.

In an embodiment, when the electronic device 110 is in an intermediate state, the first side member 1011 and the second side member 1021 may be arranged at a certain angle to each other. The surface of the first area 161 and the surface of the second area 162 of the display 160 may form an angle larger than that the folded state and smaller than that of the unfolded state. At least a part of the folding area 163 may be formed as a curved-surface having a predetermined curvature, and the curvature, at this time, may be smaller than that of the folded state. The various electronic devices 110 disclosed in the disclosure may be an electronic device having an expandable display, and may include a sliding type rollable electronic device in which at least a portion of a display disposed in a housing can move in an unfolded state or a rolling type rollable electronic device in which at least a portion of a display disposed in a housing can be rolled by a roller.

However, displays forming the exterior of electronic devices and thus can be damaged by external impacts. Therefore, an electronic device including a display typically includes a single window or multiple windows, thereby protecting the display.

The window may be securely attached to another element of the display device. However, if the window is solely damaged, it is desirable to only remove and replace the window. Certain embodiments presented below may provide the foregoing benefits, as well as others.

Figure 3:
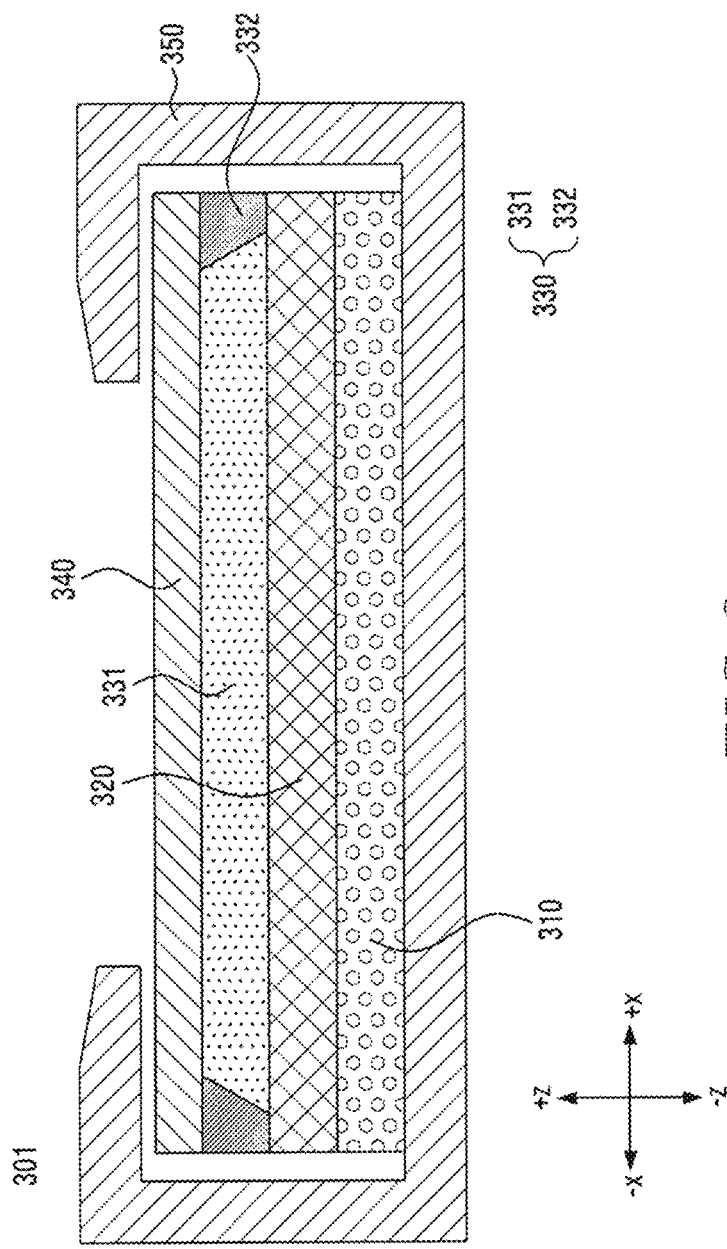
FIG. 3 is a view showing a stacked structure of a display of an electronic device according to an embodiment.

FIG. 3 is a view showing a stacked structure of a display of an electronic device according to an embodiment.

A foldable electronic device 301 of FIG. 3 may be configured to correspond to the electronic device 110 of FIG. 1 and FIG. 2 described above. For an example, the electronic device 301 may include a part or the whole of components constituting the electronic device 110 FIG. 1 and FIG. 2.

The foldable electronic device 301 may include a housing (e.g., the housing 100 of FIG. 1), a flexible display 310, a window 320, an adhesive layer 330, that includes a first area 331 and a second area 332, and a protective layer 340. In certain embodiments, the window 320 can be thin, such as having a thickness of less than 0.5 um.

The housing of FIG. 3 may include some or all of the configurations of the housing 100 of FIG. 1.

The housing 100 may form the exterior of the foldable electronic device 110 and be foldable around one axis. Hereinafter, the one axis may correspond to a folding axis to be described later.

The housing 100 may include a bezel 350. For example, the bezel 350 may be formed to extend from a portion configured to form the housing of the side surface of the electronic device 110. The bezel 350 may be disposed along an edge portion of a display module in order to fix the display 310 to the housing.

The bezel 350 may be formed to surround a stacked structure on the display 310. According to an embodiment, the bezel 350 may be formed to surround the edge of the display 310 so as to protect the side surface of the display 310.

The flexible display 310 may be disposed on at least one surface of the housing (100 of FIG. 1). According to an embodiment, the flexible display 310 to be described later may be configured to correspond to the display 160 of FIG. 1 described above.

The window 320 may be stacked on the flexible display 310. The flexible display 320 may comprises organic light emitting diodes (OLEDs) and thin film transistors (TFT) forming pixels. The window 320 may be formed of a transparent material and may include at least one of a glass material and a transparent plastic material.

The adhesive layer 330 may bond the window 320 and a protective layer 340 which is disposed on the outermost layer above the flexible display 310 and of which at least a part is exposed to the outside.

The protective layer 340 may prevent damage to the window 320 or the flexible display 310.

The adhesive layer 330 may include a first area 331 and a second area 332. The first area 331 may comprise a first adhesive, and the second area 332 may comprise a second adhesive. The first adhesive and the second adhesive may be different and have different properties.

The second area 332 may be the edge of the adhesive layer 330, and the first area 331 may the central part of the adhesive layer 330. For example, the second area 332 may surround the edge of the first area 331.

However, the range of the first area 331 and the second area 332 are formed, may not be limited thereto. For example, the second area 332 may be formed in the central part thereof.

The first adhesive may have a first adhesive strength, and the second adhesive may have a second adhesive strength stronger than the first adhesive strength. For example, the first adhesive may have an adhesive strength within the range of about 0 gf/25 mm to about 10 gf/25 mm, and the second adhesive may have an adhesive strength within the range of about 10 gf/25 mm to about 500 gf/25 mm greater than the first size.

The first area 331 comprising the first adhesive, may prevent the window 320 and the protective layer 340 from separating. For example, the first area 331 may be configured to prevent the window 320 and the protective layer 340 from being separated due to the reduction of the adhesive strength of the adhesive.

The second area 332 comprising the second adhesive having the second adhesive strength, may bond the window 320 and the protective layer 340.

The adhesive strength of the second adhesive may be weakened differently from the first adhesive. For example, the adhesive strength of the second adhesive may be weakened by an ultraviolet (UV) ray or heat. The second adhesive may include at least one of a monomer or an oligomer, having adhesion strengths that are weakened by a UV ray. According to another embodiment, the second adhesive may have a weak adhesive strength when being foamed by heat. The second area 332, onto which the second adhesive is applied, may have an adhesive strength drop to about 0 gf/25 mm by a UV ray or heat.

However, the first adhesive may also have an adhesive strength that is weakened when being foamed by heat.

The adhesive strength of the second area 332 may be weakened to 0 gf/25 mm, and thus the window 320 and the protective layer 340 may be easily separated. According to an embodiment, the window 320 and the protective layer 340 may be easily separated so that the protective layer 340 is easily replaced without replacing the window 320.

The bezel 350 and an area of the stacked structure of the display may be configured to overlap when seen from one axis (e.g., the z axis).

The overlapping area of the bezel 350 on the one axis (e.g., the z-axis) may be configured to correspond to at least a part of the second area 332. For example, referring to FIG. 3, when seen from the one axis (e.g., the z-axis), the bezel 350 may be configured to cover or hide the entirety of the second area 332 and a part of the first area 331. For another example, the bezel 350, which is configured to form the exterior of the electronic device 110, may be configured to cover or hide only the entirety of the second area 332.

The bezel 350 may be configured to cover the entirety of the second area 332, and thus the bezel 350 may be configured to cover the boundary surface between the first area 331 and the second area 332. Through this, the boundary surface between the first area 331 and the second area 332 may not be exposed to the outside of the electronic device 110.

The second adhesive forming the second area 332, may have lower transparency than the first adhesive. Accordingly, the second area 332 may have at least a part of a screen output from the display 310, that is blocked by the second adhesive, or the second adhesive may be seen from the outside. Accordingly, the second adhesive may be disposed in the second area 332 covered by the bezel 350.

However, the area covered by the bezel 350 may not be limited thereto. For example, the bezel 350 may be configured to cover up to a part of the first area 331 or only a part of the second area 332.

The first adhesive may have a transmittance distinct from the second adhesive. The first adhesive may have a first transmittance, and the second adhesive may have a second transmittance.

The first area 331 comprising the first adhesive, may be positioned on the flexible display 310, and be configured to be exposed to the outside. The first transmittance of the first adhesive may be formed within the range of 90% to 100%.

The second area 332, onto which the second adhesive is applied, may covered by the bezel 350. For example, the second area 332 may be covered by the bezel 350 so as to be obscured from the outside. The transmittance of the second adhesive can be freely formed within the range of 0% to 100%.

A specific embodiment related to the adhesive layer 330 and the adhesive will be described later with reference to FIG. 4, FIG. 5, and FIG. 6.

Figure 4:
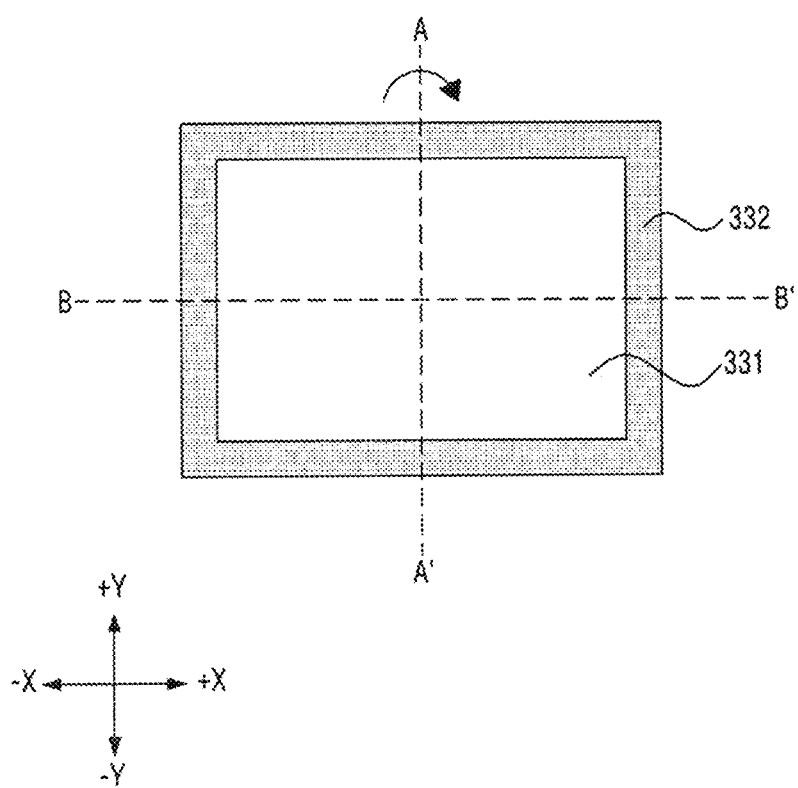
FIG. 4 is a view showing an adhesive layer of a display according to an embodiment.

FIG. 4 is a view showing an adhesive layer of a display according to an embodiment.

FIG. 4 is a view showing an area, onto which an adhesive of the adhesive layer 330 is applied, according to an embodiment. According to an embodiment, a first adhesive and a second adhesive may be applied onto the adhesive layer 330.

The adhesive layer 330 may include a first area 331 and a second area 332.

According to an embodiment, a first adhesive may be applied onto the first area 331, and a second adhesive may be applied onto the second area 332. The second area 332 may be applied to at least one area along the edge of the first area 331.

For example, the first area 331 may be applied in a rectangular shape on one plane (e.g., the xy plane), and the second area 332 may be formed in a rectangular shape to surround the edge of the first area 331.

However, the form, in which the first area 331 and the second area 332 are applied, may not be limited thereto. For example, the first area and the second area may be formed in various shapes such as a circle or an ellipse. In addition, the second area 332 may be formed to surround a part of the edge of the first area 331.

Referring to FIG. 4, The A-A' axis may mean a folding axis of the electronic device 110. The B-B' axis may mean an axis (hereinafter, a "non-folding axis") perpendicular to the folding axis of the electronic device 110.

Hereinafter, the A-A' axis to be described later may mean a folding axis, and the B-B' axis may mean a non-folding axis.

Figure 5:
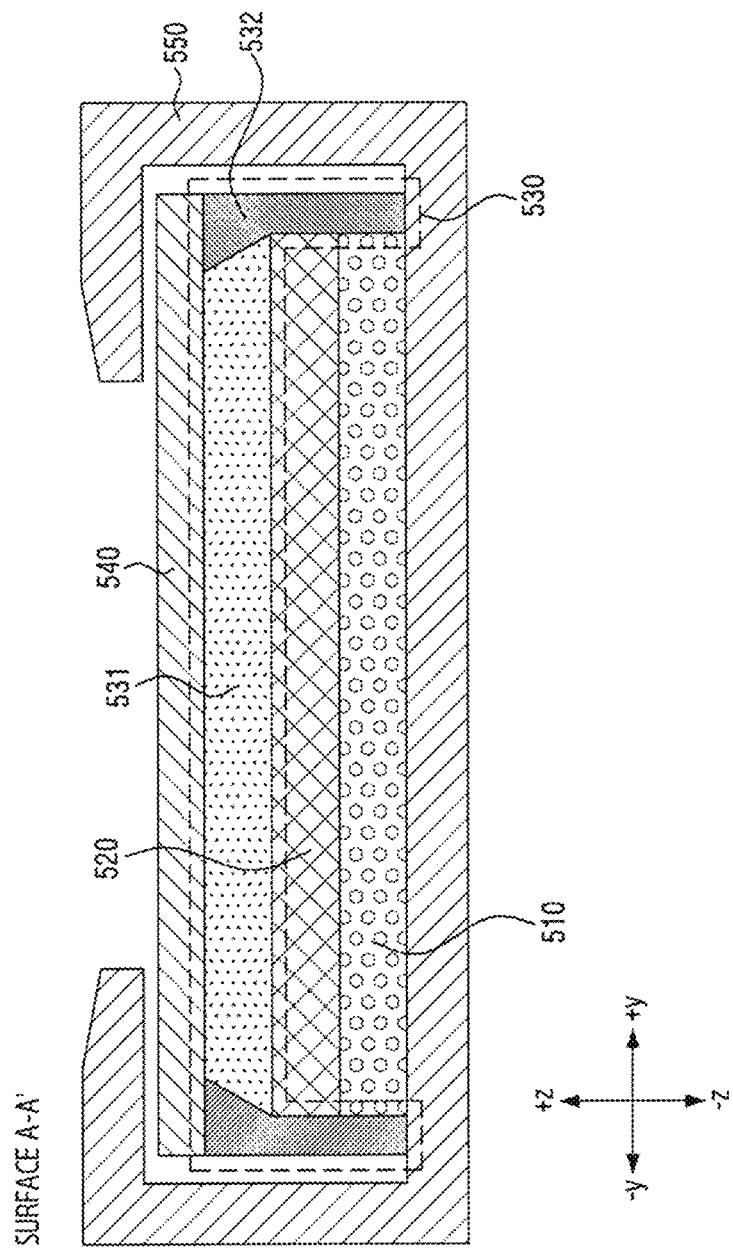
FIG. 5 is a view showing the surface A-A' of a display according to an embodiment.

FIG. 5 is a view showing the surface A-A' of a display according to an embodiment.

FIG. 5 is a view showing a stacked structure on a display 510 of the folding axis AA' of the electronic device 110 according to an embodiment.

The electronic device 110 may include a display 510, a window 520, an adhesive layer 530, and a protective layer 540, on the folding axis AA'.

The adhesive layer 530 may include a first area 531 comprising a first adhesive, and a second area 532 comprising a second adhesive, in one area of opposite ends of the first area 531.

Referring to FIG. 5, The second area 532 formed around the folding axis AA' may be formed up to an area configured to surround the edges of the display 510 and the window 520. One surface of the second area 532 may extend in the first direction (e.g., the −z direction), in the adhesive layer 530. For example, a part of the second area 532 may be configured to extend in the first direction (e.g., the −z direction) so as to surround side parts of the display 510 and the window 520.

A second area 532 may surround the side surfaces of the display 510 and the window 520 so that the second area 532 protects the side surfaces of the display 510 and the window 520.

In addition, the second area 532 may fix the display 510 and the window 520 to the bezel 550. The second area 532, which is formed to surround the side parts thereof, may prevent the separation of the display 510 or the window 520 due to repeated folding of the electronic device 110.

Figure 6:
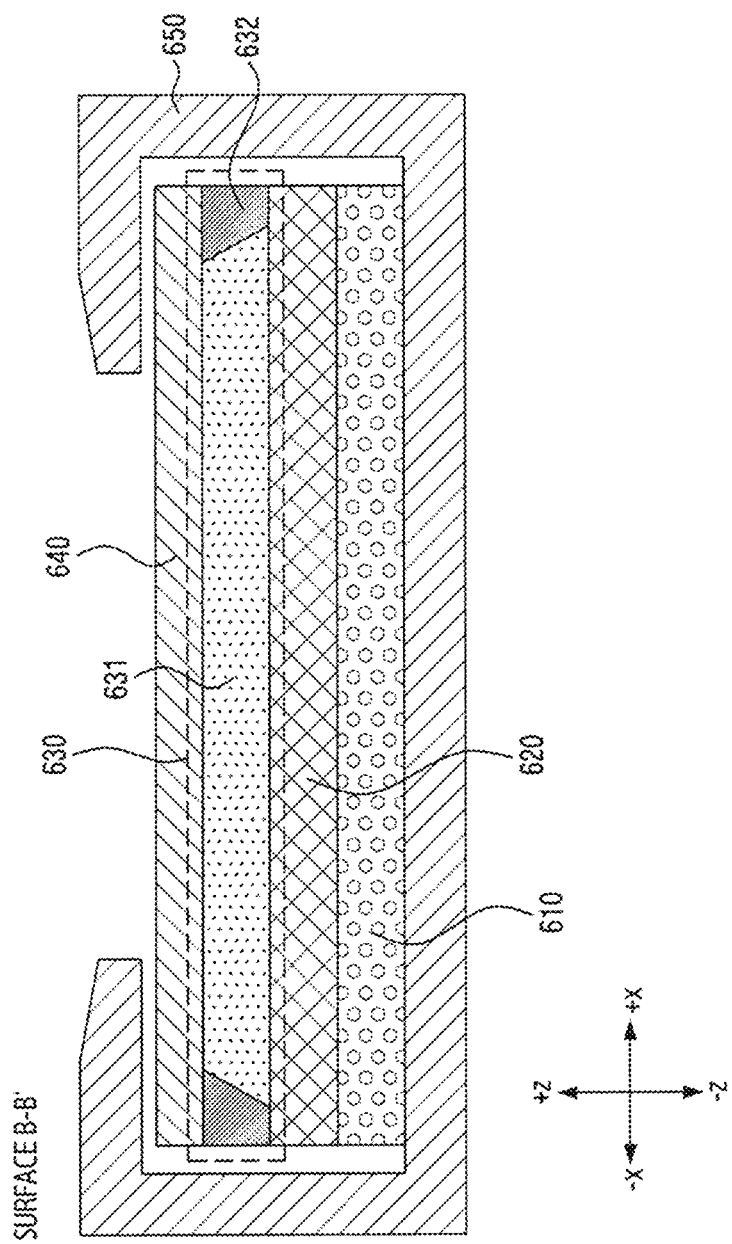
FIG. 6 is a view showing the surface B-B' of a display according to another embodiment.

FIG. 6 is a view showing the surface B-B' of a display according to another embodiment.

FIG. 6 is a view showing a stacked structure on a display 610 of the non-folding axis BB' of the electronic device 110 according to an embodiment. The electronic device 110 on the non-folding axis BB' may include a display 610, a window 620, an adhesive layer 630, and a protective layer 640.

Differently from the adhesive layer 530 of FIG. 5, a second area 632 of the adhesive layer 630 of FIG. 6 may be configured so as not extend in one direction (e.g., the −z direction). For example, the second area 632 may be formed only on the adhesive layer 630.

Figure 7:
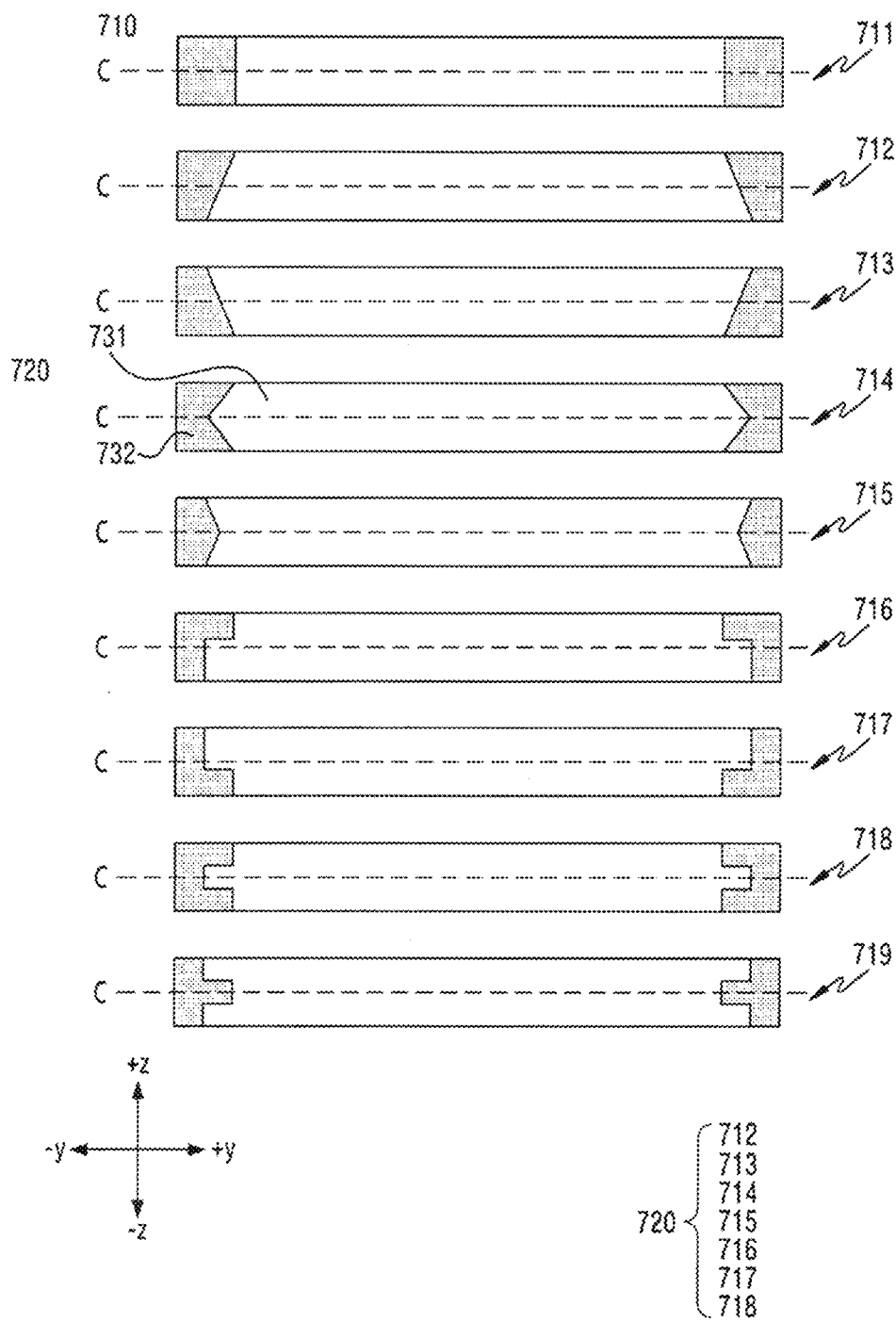
FIG. 7 is a view showing a cross-section of an adhesive layer of a display according to an embodiment.

FIG. 7 is a view showing a cross-section of an adhesive layer of a display according to an embodiment.

According to an embodiment, FIG. 7 shows a cross-section of an adhesive layer 730 of an electronic device. For example, FIG. 7 may show a cross-section (e.g., the yz plane) of the adhesive layer 530 of FIG. 5 of the electronic device 100, but may not be limited thereto. For another example, a cross-section (e.g., the xy plane) of the adhesive layer 630 of FIG. 6 may be illustrated therein.

The adhesive layer 730 may include a first area 731 and a second area 732. For example, the second area 732 may be formed at opposite ends of the first area 731 to surround the edge of the first area 731.

A central axis C thereof may mean a first axis (e.g., the z axis) of the adhesive layer 730. The central axis C is not limited to being positioned at the center of the adhesive layer, and it may be any other height inside the adhesive layer 730.

The surface facing the first direction (e.g., the +z direction) of the second area 732 may be referred to as an upper cross-section, and the surface facing a second direction (e.g., the −z direction) of the second area 732 may be referred to as a lower cross-section.

The cross-section of the adhesive layer 730 may be formed as a first structure 710 or a second structure 720.

The first structure 710 may include a first cross-section 711. The first structure 710 may be a structure in which the width of the second area 732, on which the second adhesive is disposed, is uniformly formed.

The second structure 720 may include a second cross-section 712, a third cross-section 713, a fourth cross-section 714, a fifth cross-section 715, a sixth cross-section 716, a seventh cross-section 717, an eighth cross-section 718, and/or a ninth cross-section 719.

In first cross-section 711, the first area 731 and the second area 732 may be formed to be parallel on one axis (e.g., the Z axis). According to an embodiment, in the first cross-section 711, the boundary surface between the first area 731 and the second area 732 may be formed to be perpendicular to the adhesive layer 730. The second area 732 may be formed from the central axis C of the adhesive layer 730 in the first axis direction (e.g., the z axis), and the second area 732 may have a width formed to uniformly extend.

According to an embodiment, in the second cross-section 712, the second area 732 may be formed as a cross-section configured to cover a part of the first area 731. The second area 732 of the second cross-section 712 may be formed in a trapezoidal shape. For example, the width of the second area 732 may be gradually increased as going far away from the central axis C in the first direction (e.g., the +z direction). For example, the second area 732 may have a shape having an upper end wider than a lower end with reference to the central axis C. The second area 732 may have a shape, in which an upper end thereof is gradually increased more than the lower than, may be configured to physically restrain the first area 731 on the window (320 of FIG. 3). Through this, the second area 732 may be configured to prevent the first area 731 from being lifted therefrom.

The third cross-section 713 may be formed inversely to the second cross-section 712. For example, the width of the second area 732 may be gradually increased as going far away from the central axis C in the second direction (e.g., the −z direction). For example, the second area 732 may have a shape having an upper end wider than a lower end with reference to the central axis C. The lower end of the second area 732 may be formed to be wide, and thus the adhesive layer 730 may be strongly fixed on the window 320.

The fourth cross-section 714 may be formed by combining the second cross-section 712 and the third cross-section 713. According to an embodiment, in the fourth cross-section 714, the second area 732 may be formed to have a width which is symmetrical with reference to the central axis C and gradually increases as extending toward the upper end and lower end thereof. For example, the width of the second area 732 may gradually decrease as going from the upper end thereof to the central axis C, and then the width of the second area 732 may gradually increase as going from the central axis C to the lower end thereof. The widths of the upper end and lower end of the second area 732 may be formed to be symmetrical with reference to the central axis.

The fifth cross-section 715 may be formed inversely to the fourth cross-section 714. According to an embodiment, in the fifth cross-section 715, the second area 732 may be formed to have a width which is gradually decreases as extending from the central axis C to the upper end and lower end thereof. For example, the width of the second area 732 may gradually increase as going from the upper end thereof to the central axis C, and then the width of the second area 732 may gradually decreases as going from the central axis C to the lower end thereof. The width of the second region 732 at the upper end and lower end may be formed to be symmetrical with reference to the central axis.

In the sixth cross-section 716, a cross-section of the adhesive layer 730, in which the second area 732 has two layers having different widths, is illustrated therein. According to an embodiment, differently from the second cross-section 712, in the second area 732 of the sixth cross-section 716, the second area 732 of the layer, which is formed at the upper end side of the adhesive layer 730, may be formed to have a width wider than the width of the second area 732 of the layer, which is formed at the lower side thereof. According to an embodiment, with reference to the central axis C, the width of the second area 732, which formed to be adjacent to the upper end thereof, may be formed to have a width greater that the width of the second area 732 formed to be adjacent to the lower end thereof. For example, the cross-section of the second area 732 may be formed in an inverted-L shape.

In the seventh cross-section 717, a cross-section of the adhesive layer 730, which has two layers having different widths, is illustrated therein. The seventh cross-section 717 may be formed inversely to the sixth cross-section 716. According to an embodiment, differently from the third cross-section 713, in the second area 732 of the seventh cross-section 717, the width of the second area 732 of the layer, which is formed at the lower end side of the adhesive layer 730, may be formed to have a width wider than the width of the second area 732 of the layer, which is formed at the upper end side thereof. According to an embodiment, with reference to the central axis C, the width of the second area 732, which is formed to be adjacent to the lower end thereof, may be formed to have a width greater that the width of the second area 732 formed to be adjacent to the upper end thereof. For example, the cross-section of the second area 732 may be formed in an L shape.

In the eighth cross-section 718, a cross-section of the adhesive layer 730, which has two layers having different widths, is illustrated therein.

The eighth cross-section 718 may be formed by combining the sixth cross-section 716 and the seventh cross-section 717. According to an embodiment, with reference to the central axis C, the width of the second area 732 of the eighth cross-section 718 may have portions which are adjacent to the upper end and the lower end of the adhesive layer 730 and are formed to have a great width. The width of the second area 732 of the layer, which is spaced from the central axis C and formed in the upper end and the lower end side of the adhesive layer 730, may be formed to have a width greater than the width of the second area 732 of the layer formed to be adjacent to the central axis C. For example, the cross-section of the second area 732 of the eighth cross-section 718 may be formed in a C shape.

According to another embodiment, in the ninth cross-section 719, a cross-section of the adhesive layer 730, which has two layers having different widths, is illustrated therein.

The ninth cross-section 719 may be formed inversely to the eighth cross-section 718. The width of the second area 732 of the ninth cross-section 719 may have a portion which is adjacent to the central axis C and is formed to have a great width. The width of the second area 732 of the layer, which is formed to be adjacent to the central axis C, may be formed to have a width greater than the width of the second area 732 of the layer, which is spaced apart from the central axis C and formed on the upper end and the lower end side of the adhesive layer 730. For example, the cross-section of the second area 732 of the ninth cross-section 719 may be formed in a T shape.

However, the second structure 720 may not be limited to any one of the first cross-section 711 to the ninth cross-section 719. For example, the cross-section of the adhesive layer 730 may be formed by combining the third cross-section 713 and the sixth cross-section 716.

Figure 8:
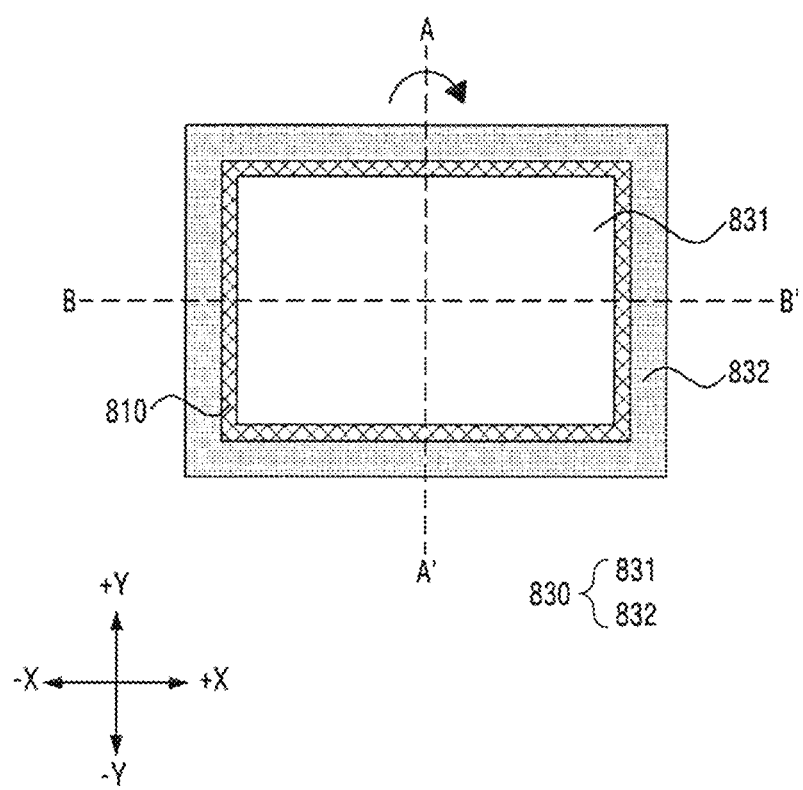
FIG. 8 is a view showing an adhesive layer of a display according to an embodiment.

FIG. 8 is a view showing an adhesive layer of a display according to an embodiment.

According to an embodiment, FIG. 8 is a view showing a differential boundary structure (720 of FIG. 7) of an adhesive layer 830.

Referring to FIG. 8, The adhesive layer 830 may include a first area 831 and a second area 832. According to an embodiment, an entire boundary surface 810 between the first area 831 and the second area 832 may be formed as at least one of the second structures (720 of FIG. 7).

The boundary surface 810 may be formed as the second structures 720 of FIG. 7, and thus the second area 832 may fix the first area 831 on a window (321 of FIG. 3). For example, the boundary surface 810 between the second area 832 and the first area 831 may be formed as the second cross-section 712 of FIG. 7.

The boundary surface 810 may be formed as the second structure 712 of FIG. 7, and thus the second area 832 may structurally fix the first area 831. By the structural fixation, the second area 832 may prevent the first area 831 from separating from the window 320.

However, it may not be limited thereto, and the boundary surface 810 may be formed as the first structure 710 of FIG. 7.

Figure 9:
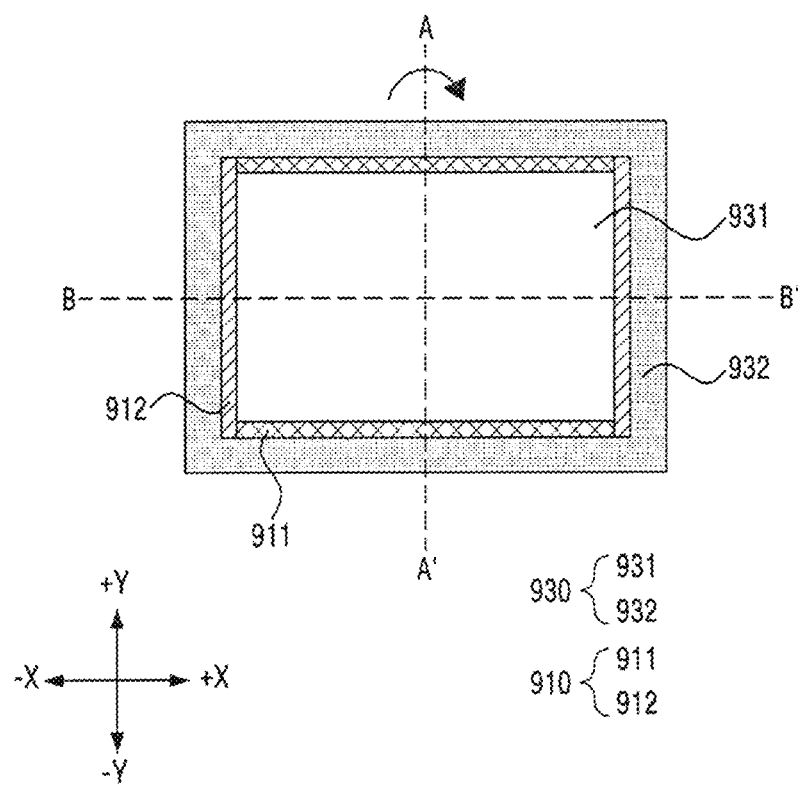
FIG. 9 is a view showing an adhesive layer of a display according to another embodiment.

FIG. 9 is a view showing an adhesive layer of a display according to another embodiment.

FIG. 9 is a view showing a second structure (720 of FIG. 7) for each area of adhesive layer 930.

The A-A' axis may mean a folding axis, and the B-B' axis may mean a non-folding axis. According to an embodiment, a boundary surface 910 between a first area 931 and a second area 932 may include a first boundary surface 911 having the folding axis AA' as the center thereof and a second boundary surface 912 which is perpendicular to the first boundary surface 911 and has the non-folding axis BB' as the center thereof. The second boundary surface 912 may include the first cross-section 711 of FIG. 7, and the first boundary surface 911 may include the second structure 720 of FIG. 7. For example, the first boundary surface 911 may be formed as the second cross-section 712. According to an embodiment, a first area 931 and a second area 932, which are adjacent to the folding axis AA', may be strongly coupled by the second cross-section 712 of the first boundary surface 911.

The second area 932 may be configured to prevent the first area 1031 from being separated from a window (321 of FIG. 3) of the adhesive layer 930 due to folding, by the second structure 720 of FIG. 7.

Figure 10:
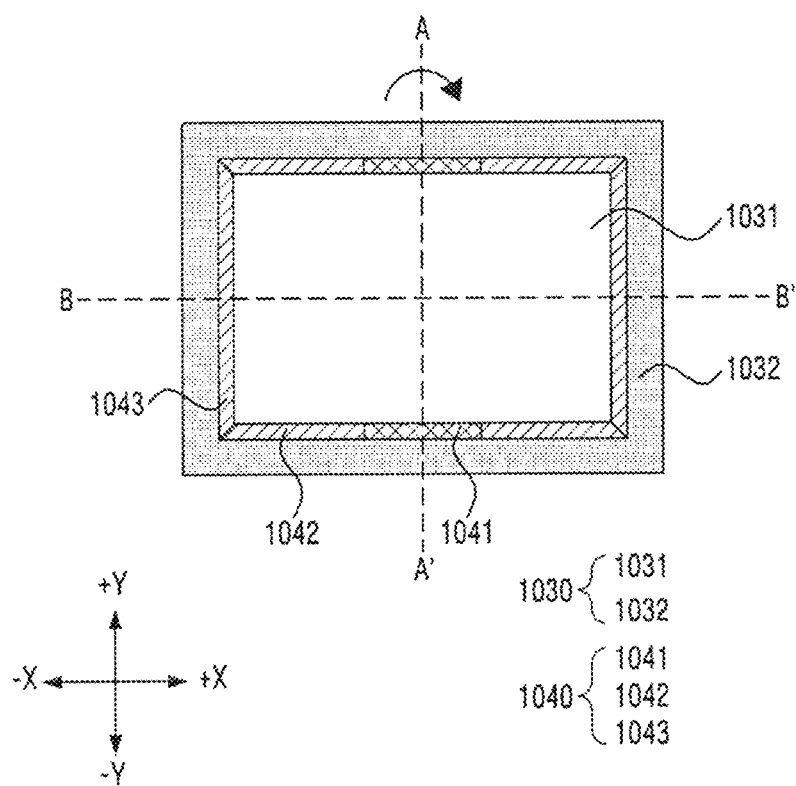
FIG. 10 is a view showing an adhesive layer of a display according to another embodiment.

FIG. 10 is a view showing an adhesive layer of a display according to another embodiment.

FIG. 10 is a view showing another differential boundary structure for each area of an adhesive layer 1030.

The boundary surface between the first area 1031 and the second area 1032 may include a first surface (e.g., the xz plane) perpendicular to the folding axis AA' and a second surface (e.g., the yz plane) perpendicular to the first surface and parallel to the folding axis AA'.

The first surface (e.g., xz plane) may include a first boundary surface 1041 adjacent to the folding axis AA' and parallel to the non-folding axis BB', and a second boundary surface 1042 which is spaced apart from the folding axis AA' and is parallel to the non-folding axis BB'. The second surface (e.g., the yz plane) may include a third boundary surface 1043 parallel to the folding axis AA'.

The second boundary surface 1042 and the third boundary surface 1043 may include the first cross-section 711 of FIG. 7. The first boundary surface 1041 may include the second structure 720 of FIG. 7. For example, the first boundary surface 1041 may include the second cross-section 712 of FIG. 7.

Differently from the first boundary surface 911 of FIG. 9, the first boundary surface 1041 of FIG. 10 may include the second structure 720 having a reduced range, and thus the adhesive layer 1030 may have a structure which can be easily manufactured.

Figure 11:
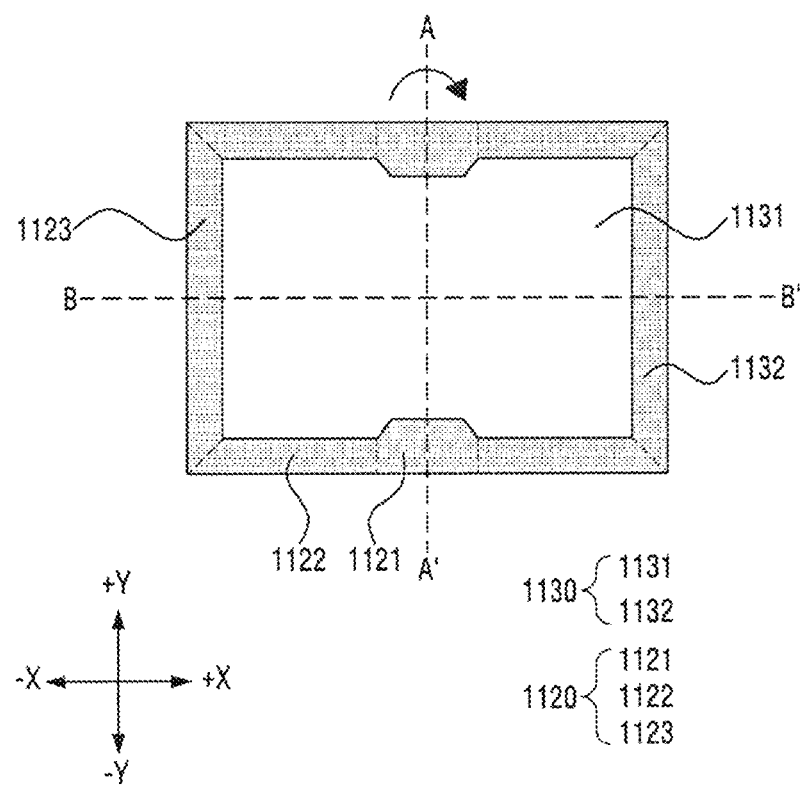
FIG. 11 is a view showing an adhesive layer of a display according to another embodiment.

FIG. 11 is a view showing an adhesive layer of a display according to another embodiment.

FIG. 11 is a view showing a differential width of the adhesive layer 930.

A second area 1132 may include a first portion 1121, a second portion 1122, and a third portion 1123. The boundary surface between a first area 1131 and a second area 1132 may include a first surface (e.g., the xz plane) perpendicular to the folding axis AA' and a second surface (e.g., the yz plane) perpendicular to the first surface and parallel to the folding axis AA'.

A first surface (e.g., the xy plane) may include the first portion 1121 and the second portion 1122, and a second surface (e.g., the yz plane) may include the third portion 1123. The first portion 1121 to the third portion 1123 may mean the width of the second area 1132.

The first portion 1121 may be adjacent to the folding axis AA' and may be formed on the first surface. The second portion 1122 may be spaced apart from the folding axis AA' and may be formed on the first surface.

The first portion 1121, the second portion 1122, and the third portion 1123 may be formed to have different widths.

The first portion 1121 may have a first width, and the second portion 1122 and the third portion 1123 may have a second width smaller than the first size. For example, the first portion 1121 of the second area 1132 may be configured to extend in a direction toward the inside of the electronic device and thus may be formed to be wide.

The first portion 1121 may be formed to be adjacent to the folding axis AA', and thus the first portion 1121 may be configured to prevent an adhesive layer 1130 from being lifted from a window (321 of FIG. 3) due to the repeated folding operations of the electronic device.

Figure 12:
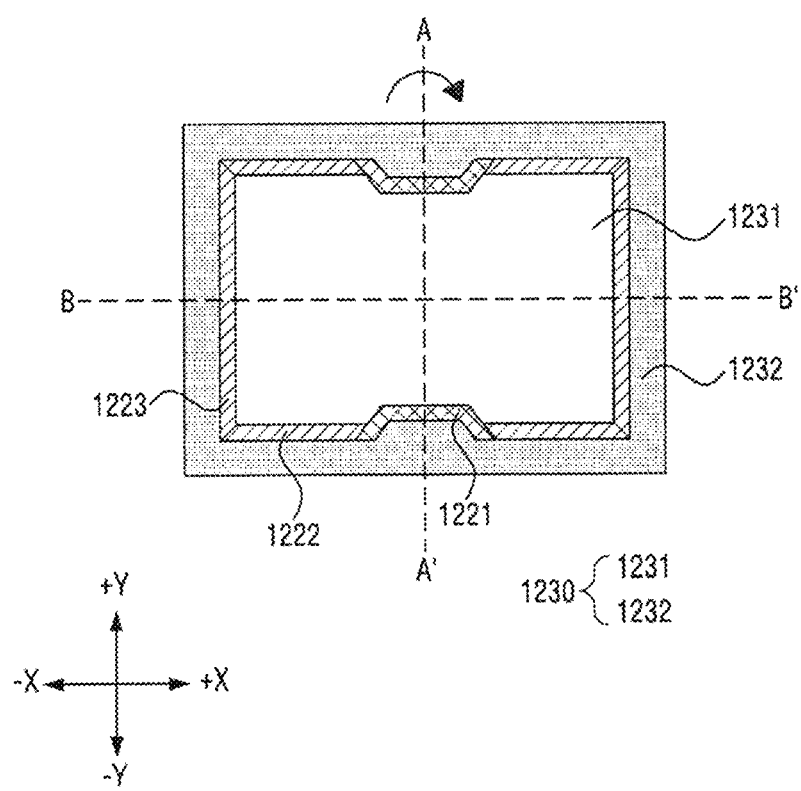
FIG. 12 is a view showing an adhesive layer of a display according to another embodiment.

FIG. 12 is a view showing an adhesive layer of a display according to another embodiment.

FIG. 12 is a view showing a structure in which the second structure 720 of the adhesive layer 930 and a differential width structure are combined.

A second area 1232 may include the first portion 1121, the second portion 1122, and the third portion 1123. The boundary surface between the first area 1231 and the second area 1232 may include a first surface (e.g., the xz plane) perpendicular to the folding axis AA' and a second surface (e.g., the yz plane) perpendicular to the first surface and parallel to the folding axis AA'.

The first surface (e.g., the xy plane) may include a first portion 1221 and a second portion 1222, and the second surface (e.g., the yz plane) may include a third portion 1223 having the non-folding axis BB' as the center thereof. The first portion 1221 may be formed on the first surface adjacent to the folding axis AA', and the second portion 1222 may be formed on the first surface to be spaced apart from the folding axis AA'. The first portion 1221 to the third portion 1223 may mean the width of the second area 1232.

The first portion 1221 adjacent to the folding axis AA' may be formed to have a structure in which the second structure 720 of FIG. 10 and the differential width structure of FIG. 11 are combined.

For example, the first portion 1221 may have a first width on the second area 1232, and the second portion 1222 and the third portion 1223 may have a second width smaller than the first size. In addition, the second portion 1222 and the third portion 1223 may include the first cross-section 711 of FIG. 7.

The first portion 1221 may include the second structure 720 of FIG. 7. For example, the boundary surface of the first portion 1221 may include the second cross-section 712 of FIG. 7. The first portion 1221 may be formed to have a wide width to include a second cross-section 712, and thus the first portion 1221 may be configured to prevent the adhesive layer 1230 from being lifted due to a folding operation of the electronic device.

Figure 13:
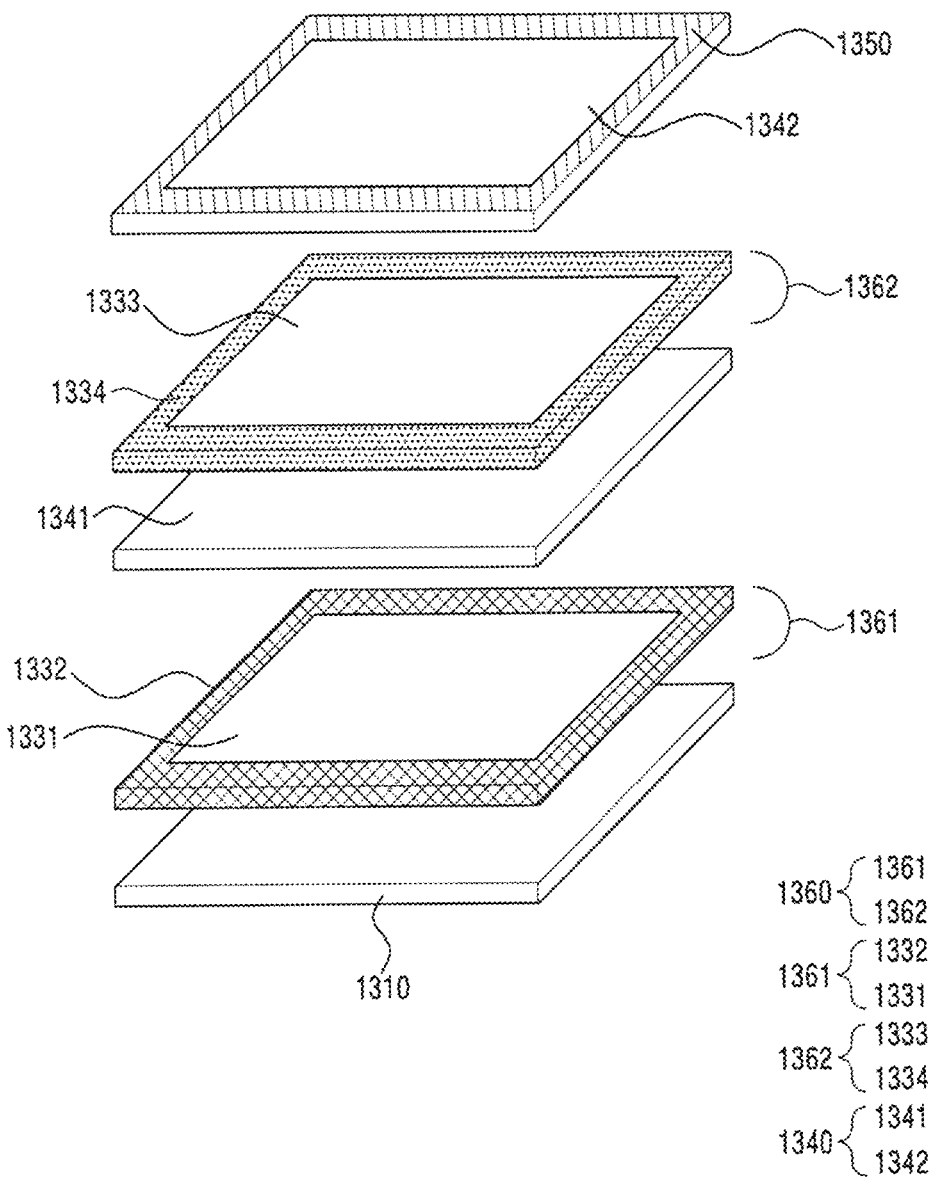
FIG. 13 is a view showing a stacked structure of a display according to an embodiment.

FIG. 13 is a view showing a stacked structure of a display according to an embodiment.

Referring to FIG. 13 is a view showing multiple windows 1340 and an adhesive layer 1360 stacked on a flexible display 1310 of an electronic device (110 of FIG. 1) according to an embodiment.

The electronic device 110 may include a flexible display 1310, multiple windows 1340, multiple adhesive layers 1360, and a housing (100 of FIG. 1).

The housing 100, which is configured to form the exterior of the electronic device 110, may include a bezel disposed at a position corresponding to a bezel area 1350 on a second window 1342. The multiple windows 1340 may include a first window 1341 bonded onto the flexible display 1310 and a second window 1342 bonded onto the first window 1341 and exposed to the outside.

The multiple adhesive layers 1360 may include a first adhesive layer 1361 bonding the flexible display 1310 and the first window 1341, and a second adhesive layer 1362 bonding the first window 1341 and the second window 1342.

The multiple adhesive layers 1360 may include first areas 1331 and 1333 comprising a first adhesive, and second areas 1332 and 1334 comprising a second adhesive. The second areas 1332 and 1334 may include the bezel area 1350. The second areas 1332 and 1334 may be formed along the edges of the first areas 1331 and 1333. According to an embodiment, a bezel, which is disposed on the bezel area 1350, may cover the boundary surfaces between the second areas 1332 and 1334 and the first areas 1331 and 1333.

The adhesive layer 1360 may comprise the first adhesive and the second adhesive of which the adhesive strength can be weakened. For example, the first areas 1331 and 1333 may comprise the first adhesive, and the second areas 1332 and 1334 may comprise the second adhesive.

The second area 1332 of the first adhesive layer 1361 may be applied by the second adhesive including at least one of a monomer or an oligomer of which the adhesive strengths are weakened by an ultraviolet (UV) ray. The second area 1334 of the second adhesive layer 1362 may be applied by the second adhesive having a weak adhesive strength when being foamed by heat.

However, the order and configuration of the adhesive layer 1360, onto which the second adhesive is applied, may not be limited thereto. For example, the first adhesive layer 1361 may be applied by the second adhesive having a weak adhesive strength when being foamed by heat.

According to an embodiment, multiple windows 1340 may be selectively separated by the second adhesive of which the adhesive strength can be weakened.

For example, the adhesive strength of the second area 1334 of the second adhesive layer 1362 may be weakened by a UV ray.

Through this, the second window 1342, which is bonded to the second adhesive layer 1362, may be selectively separated from the electronic device 110. According to an embodiment, at least one of the multiple windows 1340 may be selectively separated from the electronic device 110, so as to easily replace a broken window.

However, the adhesive, of which the adhesive strength can be weakened, may not be limited to the second adhesive. For example, the adhesive strength of the first adhesive may also be weakened.

Figure 14:
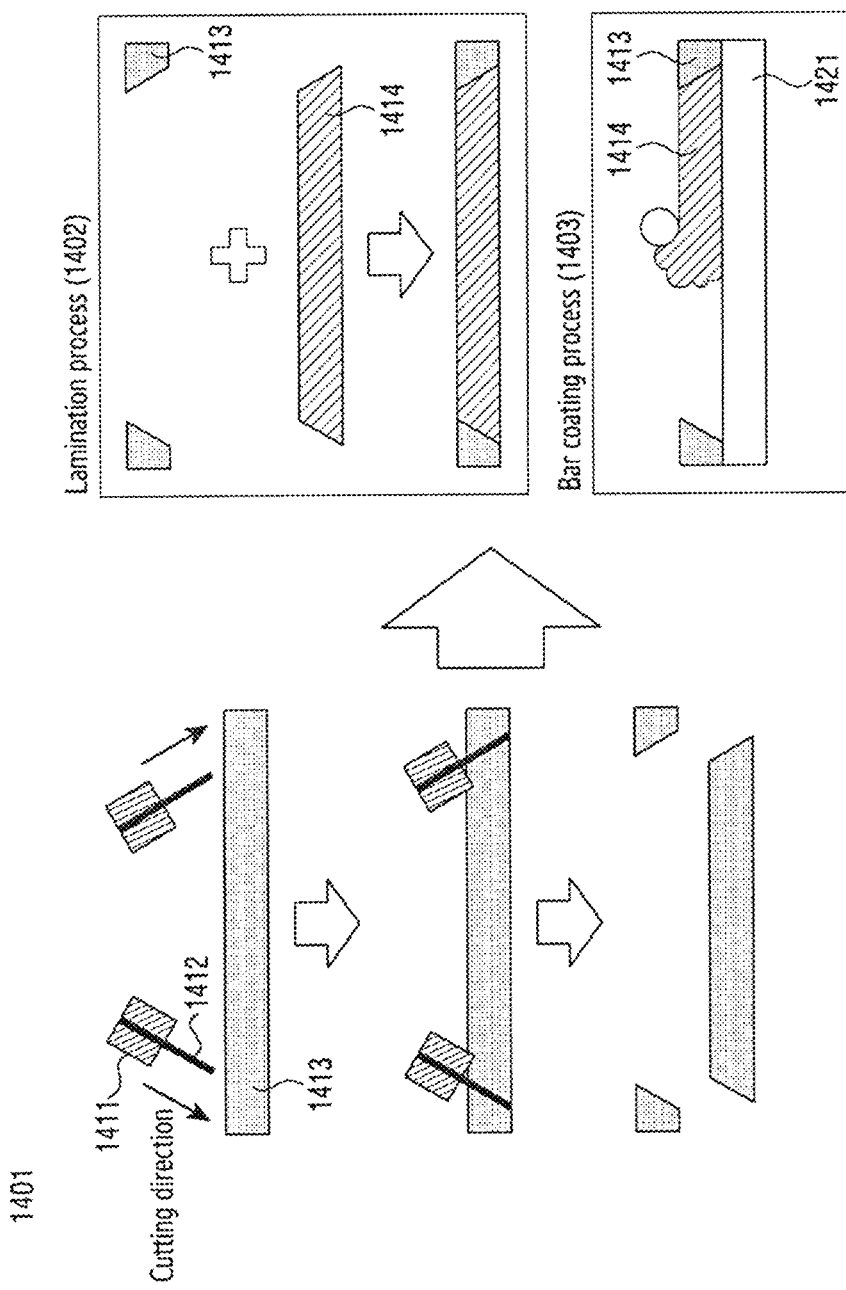
FIG. 14 is a view showing the process of processing an adhesive layer according to an embodiment.

FIG. 14 is a view showing the process of processing an adhesive layer according to an embodiment.

Referring to FIG. 14, according to an embodiment, a process 1401 may include a process of cutting a second area 1413 of an adhesive layer 1410. The process 1401 may include a process in which the degree of inclination in the cutting direction of a knife blade 1412 for cutting an adhesive layer is adjusted so as to cut at least a part of the second area 1413.

A process 1402 may include a process of combining the second area 1413, which is cut in the process 1401, to a first area 1414 applied in advance. For example, the process 1402 may include a lamination process.

A process 1403 may include a process of applying the second area 1413, which is cut in the process 1401, onto a window 1421 and then applying the first area 1414 to the inner space of a second area 1413.

The process of processing the adhesive layer may include the process 1401 and the process 1402, or may include the process 1401 and the process 1403.

Figure 15:
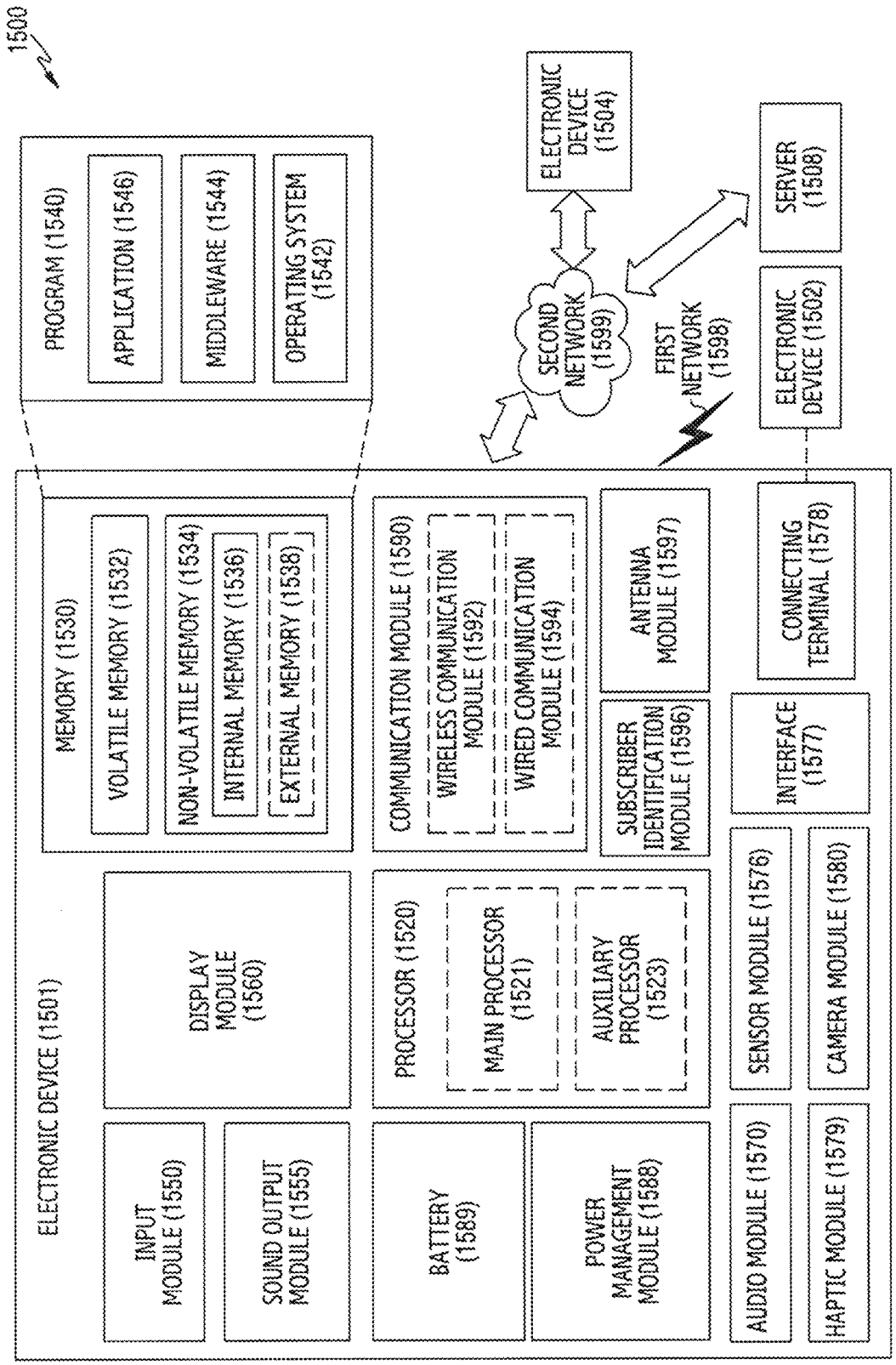
FIG. 15 is a view showing an electronic device in a network environment according to an embodiment.

FIG. 15 is a block diagram illustrating an electronic device 1501 in a network environment 1500 according to certain embodiments. Referring to FIG. 15, the electronic device 1501 in the network environment 1500 may communicate with an electronic device 1502 via a first network 1598 (e.g., a short-range wireless communication network), or at least one of an electronic device 1504 or a server 1508 via a second network 1599 (e.g., a long-range wireless communication network). The electronic device 1501 may communicate with the electronic device 1504 via the server 1508. The electronic device 1501 may include a processor 1520, memory 1530, an input module 1550, a sound output module 1555, a display module 1560, an audio module 1570, a sensor module 1576, an interface 1577, a connecting terminal 1578, a haptic module 1579, a camera module 1580, a power management module 1588, a battery 1589, a communication module 1590, a subscriber identification module (SIM) 1596, or an antenna module 1597. In some embodiments, at least one of the components (e.g., the connecting terminal 1578) may be omitted from the electronic device 1501, or one or more other components may be added in the electronic device 1501. In some embodiments, some of the components (e.g., the sensor module 1576, the camera module 1580, or the antenna module 1597) may be implemented as a single component (e.g., the display module 1560).

The processor 1520 may execute, for example, software (e.g., a program 1540) to control at least one other component (e.g., a hardware or software component) of the electronic device 1501 coupled with the processor 1520, and may perform various data processing or computation. According to one embodiment, as at least part of the data processing or computation, the processor 1520 may store a command or data received from another component (e.g., the sensor module 1576 or the communication module 1590) in volatile memory 1532, process the command or the data stored in the volatile memory 1532, and store resulting data in non-volatile memory 1534. The processor 1520 may include a main processor 1521 (e.g., a central processing unit (CPU) or an application processor (AP)), or an auxiliary processor 1523 (e.g., a graphics processing unit (GPU), a neural processing unit (NPU), an image signal processor (ISP), a sensor hub processor, or a communication processor (CP)) that is operable independently from, or in conjunction with, the main processor 1521. For example, when the electronic device 1501 includes the main processor 1521 and the auxiliary processor 1523, the auxiliary processor 1523 may be adapted to consume less power than the main processor 1521, or to be specific to a specified function. The auxiliary processor 1523 may be implemented as separate from, or as part of the main processor 1521.

The auxiliary processor 1523 may control at least some of functions or states related to at least one component (e.g., the display module 1560, the sensor module 1576, or the communication module 1590) among the components of the electronic device 1501, instead of the main processor 1521 while the main processor 1521 is in an inactive (e.g., sleep) state, or together with the main processor 1521 while the main processor 1521 is in an active state (e.g., executing an application). The auxiliary processor 1523 (e.g., an image signal processor or a communication processor) may be implemented as part of another component (e.g., the camera module 1580 or the communication module 1590) functionally related to the auxiliary processor 1523. The auxiliary processor 1523 (e.g., the neural processing unit) may include a hardware structure specified for artificial intelligence model processing. An artificial intelligence model may be generated by machine learning. Such learning may be performed, e.g., by the electronic device 1501 where the artificial intelligence is performed or via a separate server (e.g., the server 1508). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 1530 may store various data used by at least one component (e.g., the processor 1520 or the sensor module 1576) of the electronic device 1501. The various data may include, for example, software (e.g., the program 1540) and input data or output data for a command related thereto. The memory 1530 may include the volatile memory 1532 or the non-volatile memory 1534.

The program 1540 may be stored in the memory 1530 as software, and may include, for example, an operating system (OS) 1542, middleware 1544, or an application 1546.

The input module 1550 may receive a command or data to be used by another component (e.g., the processor 1520) of the electronic device 1501, from the outside (e.g., a user) of the electronic device 1501. The input module 1550 may include, for example, a microphone, a mouse, a keyboard, a key (e.g., a button), or a digital pen (e.g., a stylus pen).

The sound output module 1555 may output sound signals to the outside of the electronic device 1501. The sound output module 1555 may include, for example, a speaker or a receiver. The speaker may be used for general purposes, such as playing multimedia or playing record. The receiver may be used for receiving incoming calls. The receiver may be implemented as separate from, or as part of the speaker.

The display module 1560 may visually provide information to the outside (e.g., a user) of the electronic device 1501. The display module 1560 may include, for example, a display, a hologram device, or a projector and control circuitry to control a corresponding one of the display, hologram device, and projector. The display module 1560 may include a touch sensor adapted to detect a touch, or a pressure sensor adapted to measure the intensity of force incurred by the touch.

The audio module 1570 may convert a sound into an electrical signal and vice versa. The audio module 1570 may obtain the sound via the input module 1550, or output the sound via the sound output module 1555 or a headphone of an external electronic device (e.g., an electronic device 1502) directly (e.g., wiredly) or wirelessly coupled with the electronic device 1501.

The sensor module 1576 may detect an operational state (e.g., power or temperature) of the electronic device 1501 or an environmental state (e.g., a state of a user) external to the electronic device 1501, and then generate an electrical signal or data value corresponding to the detected state. The sensor module 1576 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1577 may support one or more specified protocols to be used for the electronic device 1501 to be coupled with the external electronic device (e.g., the electronic device 1502) directly (e.g., wiredly) or wirelessly. The interface 1577 may include, for example, a high definition multimedia interface (HDMI), a universal serial bus (USB) interface, a secure digital (SD) card interface, or an audio interface.

A connecting terminal 1578 may include a connector via which the electronic device 1501 may be physically connected with the external electronic device (e.g., the electronic device 1502). The connecting terminal 1578 may include, for example, a HDMI connector, a USB connector, a SD card connector, or an audio connector (e.g., a headphone connector).

The haptic module 1579 may convert an electrical signal into a mechanical stimulus (e.g., a vibration or a movement) or electrical stimulus which may be recognized by a user via his tactile sensation or kinesthetic sensation. The haptic module 1579 may include, for example, a motor, a piezoelectric element, or an electric stimulator.

The camera module 1580 may capture a still image or moving images. The camera module 1580 may include one or more lenses, image sensors, image signal processors, or flashes.

The power management module 1588 may manage power supplied to the electronic device 1501. According to one embodiment, the power management module 1588 may be implemented as at least part of, for example, a power management integrated circuit (PMIC).

The battery 1589 may supply power to at least one component of the electronic device 1501. The battery 1589 may include, for example, a primary cell which is not rechargeable, a secondary cell which is rechargeable, or a fuel cell.

The communication module 1590 may support establishing a direct (e.g., wired) communication channel or a wireless communication channel between the electronic device 1501 and the external electronic device (e.g., the electronic device 1502, the electronic device 1504, or the server 1508) and performing communication via the established communication channel. The communication module 1590 may include one or more communication processors that are operable independently from the processor 1520 (e.g., the application processor (AP)) and supports a direct (e.g., wired) communication or a wireless communication. The communication module 1590 may include a wireless communication module 1592 (e.g., a cellular communication module, a short-range wireless communication module, or a global navigation satellite system (GNSS) communication module) or a wired communication module 1594 (e.g., a local area network (LAN) communication module or a power line communication (PLC) module). A corresponding one of these communication modules may communicate with the external electronic device via the first network 1598 (e.g., a short-range communication network, such as Bluetooth™, wireless-fidelity (Wi-Fi) direct, or infrared data association (IrDA)) or the second network 1599 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1592 may identify and authenticate the electronic device 1501 in a communication network, such as the first network 1598 or the second network 1599, using subscriber information (e.g., international mobile subscriber identity (IMSI)) stored in the subscriber identification module 1596.

The wireless communication module 1592 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 1592 may support a high-frequency band (e.g., the mmWave band) to achieve, e.g., a high data transmission rate. The wireless communication module 1592 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 1592 may support various requirements specified in the electronic device 1501, an external electronic device (e.g., the electronic device 1504), or a network system (e.g., the second network 1599). The wireless communication module 1592 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 1597 may transmit or receive a signal or power to or from the outside (e.g., the external electronic device) of the electronic device 1501. The antenna module 1597 may include an antenna including a radiating element composed of a conductive material or a conductive pattern formed in or on a substrate (e.g., a printed circuit board (PCB)). The antenna module 1597 may include a plurality of antennas (e.g., array antennas). In such a case, at least one antenna appropriate for a communication scheme used in the communication network, such as the first network 1598 or the second network 1599, may be selected, for example, by the communication module 1590 (e.g., the wireless communication module 1592) from the plurality of antennas. The signal or the power may then be transmitted or received between the communication module 1590 and the external electronic device via the selected at least one antenna. According to an embodiment, another component (e.g., a radio frequency integrated circuit (RFIC)) other than the radiating element may be additionally formed as part of the antenna module 1597.

According to certain embodiments, the antenna module 1597 may form a mmWave antenna module. The mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1501 and the external electronic device 1504 via the server 1508 coupled with the second network 1599. Each of the electronic devices 1502 or 1504 may be a device of a same type as, or a different type, from the electronic device 1501. According to an embodiment, all or some of operations to be executed at the electronic device 1501 may be executed at one or more of the external electronic devices 1502, 1504, or 1508. For example, if the electronic device 1501 should perform a function or a service automatically, or in response to a request from a user or another device, the electronic device 1501, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1501. The electronic device 1501 may provide the outcome, with or without further processing of the outcome, as at least part of a reply to the request. To that end, a cloud computing, distributed computing, mobile edge computing (MEC), or client-server computing technology may be used, for example. The electronic device 1501 may provide ultra low-latency services using, e.g., distributed computing or mobile edge computing. In another embodiment, the external electronic device 1504 may include an internet-of-things (IoT) device. The server 1508 may be an intelligent server using machine learning and/or a neural network. The external electronic device 1504 or the server 1508 may be included in the second network 1599. The electronic device

1501 may be applied to intelligent services (e.g., smart home, smart city, smart car, or healthcare) based on 5G communication technology or IoT-related technology.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with certain embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, the module may be implemented in a form of an application-specific integrated circuit (ASIC).

Certain embodiments as set forth herein may be implemented as software (e.g., the program 1540) including one or more instructions that are stored in a storage medium (e.g., internal memory 1536 or external memory 1538) that is readable by a machine (e.g., the electronic device 1501). For example, a processor (e.g., the processor 1520) of the machine (e.g., the electronic device 1501) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities, and some of the multiple entities may be separately disposed in different components. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

A foldable electronic device according to certain embodiments may include a flexible display disposed on a front surface of the foldable electronic device, a housing configured to form the exterior of the foldable electronic device and foldable around a folding axis, the housing including a bezel formed along an edge of the flexible display, a window stacked on the flexible display, and an adhesive layer bonding the window to another element, the adhesive layer comprising a first area comprising a first adhesive, and a second area which is formed along an edge of the first area, and has an area which corresponds to the bezel, the second area comprising a second adhesive, wherein a strength of the second adhesive can be weakened in a different manner than the strength of the first adhesive.

According to an embodiment, the second area is adjacent to the folding axis, covers a part of the edge of the first area fixing the first area to the window.

According to an embodiment, the second area may include a first portion having a first width and a second portion having a second width smaller than the first width, and the first portion may be formed to be adjacent around the folding axis.

According to an embodiment, the second area may include a first portion having a first width and a second portion having a second width than the first width, and the second portion of the second area may be adjacent around the folding axis, and covers a part of the edge of the first area, which is adjacent around the folding axis fixing the first area to the window.

According to an embodiment, the second adhesive comprises an adhesive, wherein an adhesive strength of the adhesive is weakened when being foamed by heat.

According to an embodiment, the second adhesive may include at least one of a monomer and an oligomer having an adhesive strength that is by an ultraviolet (UV) ray.

According to an embodiment, the second adhesive may have a higher adhesive strength than the first adhesive.

According to an embodiment, the window may be formed of a transparent material.

According to an embodiment, boundary between the first area and the second area may be covered by a bezel.

According to an embodiment, the another layer comprises a protective layer.

According to an embodiment, the second area is formed on the folding axis, surrounds edges of the flexible display and the window fixing the display and the window.

According to certain embodiments, a foldable electronic device comprises: a flexible display disposed on a front surface of the foldable electronic device; a housing configured to form an exterior of the foldable electronic device and be foldable around an axis, the housing comprising a bezel formed along an edge of the flexible display; a first window bonded to the flexible display; and a second window bonded on the first window having one side exposed to an outside of the foldable electronic device; and an adhesive layer disposed between the flexible display and the first window bonding the flexible display and the first window, wherein the adhesive layer comprises: a first area comprising a first adhesive; and a second area formed along an edge of the first area, having an area corresponding to the bezel, the second area comprising a second adhesive; wherein an adhesive strength of the second adhesive can be weakened in a different way from the first adhesive.

According to an embodiment, the adhesive layer may include a first adhesive layer bonding the flexible display and the first window, and a second adhesive layer bonding the first window and the second window, the second adhesive of the first adhesive layer may include at least one of a monomer or an oligomer of which adhesive strengths are weakened by an ultraviolet (UV) ray or when being foamed by heat.

According to an embodiment, a boundary surface between the first area of the adhesive layer and the second area of the adhesive layer may be covered by the bezel.

According to an embodiment, the second window is exposed to an outside by the second adhesive of the second adhesive layer and is selectively separable.

According to certain embodiments, a foldable electronic device comprises: a flexible display disposed on a front surface of the foldable electronic device; a housing forming an exterior of the foldable electronic device and foldable around a folding axis, the housing comprising a bezel formed along an edge of the flexible display; a window stacked on the flexible display; and an adhesive layer bonding the window and another element of the flexible display, wherein the adhesive layer comprises: a first area, which is exposed to an outside comprising a first adhesive; and a second area covered by the bezel and formed along an edge of the first area, comprising a second adhesive; wherein an adhesive strength of the second adhesive can be weakened in a different way from the first adhesive.

According to an embodiment, the second area is adjacent to the folding axis and covers a part of the edge of the first area fixing the first area to the window.

According to an embodiment, an adhesive strength of the second adhesive is weakened when being foamed by heat.

According to an embodiment, the window may be formed of a transparent material.

According to an embodiment, a protective layer, which is bonded on the window by the adhesive layer, may be included therein.

The invention claimed is:

1. A foldable electronic device comprising:
a flexible display disposed on a front surface of the foldable electronic device;
a housing forming an exterior of the foldable electronic device and foldable around a folding axis, the housing comprising a bezel formed along an edge of the flexible display;
a window stacked on the flexible display; and
an adhesive layer bonding the window to another element, the adhesive layer comprising:
a first area comprising a first adhesive; and
a second area which is formed along an edge of the first area, and has an area which corresponds to the bezel, the second area comprising a second adhesive;
wherein a strength of the second adhesive can be weakened in a different manner than the strength of the first adhesive.

2. The foldable electronic device of claim 1, wherein the second area is adjacent to the folding axis, covers a part of the edge of the first area fixing the first area to the window.

3. The foldable electronic device of claim 1, wherein the second area comprises a first portion having a first width and a second portion having a second width smaller than the first width, and
the first portion is adjacent around the folding axis.

4. The foldable electronic device of claim 1, wherein the second area comprises a first portion having a first width and a second portion having a second width greater than the first width, and
the second portion of the second area is adjacent around the folding axis, and covers a part of the edge of the first area, which is adjacent around the folding axis, fixing the first area to the window.

5. The foldable electronic device of claim 1, wherein the second adhesive comprises an adhesive, wherein an adhesive strength of the adhesive is weakened when being foamed by heat.

6. The foldable electronic device of claim 1, wherein the second adhesive comprises at least one of a monomer and an oligomer having an adhesive strengths that is weakened by an ultraviolet (UV) ray.

7. The foldable electronic device of claim 1, wherein the second adhesive has a higher adhesive strength than the first adhesive.

8. The foldable electronic device of claim 1, wherein the window is formed of a transparent material.

9. The foldable electronic device of claim 1, wherein boundary between the first area and the second area is covered by a bezel.

10. The foldable electronic device of claim 1, wherein the another element comprises a protective layer.

11. The foldable electronic device of claim 1, wherein the second area, is formed on the folding axis, surrounds edges of the flexible display and the window fixing the flexible display and the window.

12. A foldable electronic device comprising:
a flexible display disposed on a front surface of the foldable electronic device;

a housing configured to form an exterior of the foldable electronic device and be foldable around an axis, the housing comprising a bezel formed along an edge of the flexible display;
a first window bonded to the flexible display;
a second window bonded on the first window having one side exposed to an outside of the foldable electronic device; and
an adhesive layer disposed between the flexible display and the first window bonding the flexible display and the first window, wherein
the adhesive layer comprises:
a first area comprising a first adhesive; and
a second area formed along an edge of the first area, having an area corresponding to the bezel, the second area comprising a second adhesive;
wherein an adhesive strength of the second adhesive can be weakened in a different way from the first adhesive.

13. The foldable electronic device of claim 12, wherein the adhesive layer comprises a first adhesive layer bonding the flexible display and the first window, and a second adhesive layer bonding the first window and the second window,
the second adhesive of the first adhesive layer comprises at least one of a monomer or an oligomer of which adhesive strengths are weakened by an ultraviolet (UV) ray or when being foamed by heat.

14. The foldable electronic device of claim 12, wherein a boundary between the first area and the second area of the adhesive layer is covered by the bezel.

15. The foldable electronic device of claim 13, wherein the second window is exposed to an outside by the second adhesive of the second adhesive layer and is selectively separable.

16. A foldable electronic device comprising:
a flexible display disposed on a front surface of the foldable electronic device;
a housing forming an exterior of the foldable electronic device and foldable around a folding axis, the housing comprising a bezel formed along an edge of the flexible display;
a window stacked on the flexible display; and
an adhesive layer bonding the window and another element of the flexible display, wherein
the adhesive layer comprises:
a first area, which is exposed to an outside comprising a first adhesive; and
a second area covered by the bezel and formed along an edge of the first area, comprising a second adhesive;
wherein an adhesive strength of the second adhesive can be weakened in a different way from the first adhesive.

17. The foldable electronic device of claim 16, wherein the second area is adjacent to the folding axis, and covers a part of the edge of the first area fixing the first area to the window.

18. The foldable electronic device of claim 16, wherein an adhesive strength of the second adhesive is weakened when being foamed by heat.

19. The foldable electronic device of claim 16, wherein the window is formed of a transparent material.

20. The foldable electronic device of claim 16, comprising
a protective layer bonded on the window by the adhesive layer.

* * * * *